(12) United States Patent
Bae et al.

(10) Patent No.: US 10,553,593 B2
(45) Date of Patent: Feb. 4, 2020

(54) SEMICONDUCTOR DEVICES

(71) Applicant: Samsung Electronics Co., Ltd., Suwon-si, Gyeonggi-do (KR)

(72) Inventors: Deokhan Bae, Hwaseong-si (KR); Hyonwook Ra, Hwaseong-si (KR); Hyung Jong Lee, Osan-si (KR); Juhun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/983,405

(22) Filed: May 18, 2018

(65) Prior Publication Data

US 2019/0148384 A1    May 16, 2019

(30) Foreign Application Priority Data

Nov. 10, 2017  (KR) .......................... 10-2017-0149280

(51) Int. Cl.
| | | |
|---|---|---|
| *H01L 27/11* | (2006.01) | |
| *H01L 23/522* | (2006.01) | |
| *G11C 11/412* | (2006.01) | |
| *H01L 27/092* | (2006.01) | |

(52) U.S. Cl.
CPC ...... *H01L 27/1104* (2013.01); *H01L 23/5226* (2013.01); *H01L 27/092* (2013.01); *G11C 11/412* (2013.01)

(58) Field of Classification Search
CPC ............... H01L 27/1104; H01L 27/092; H01L 23/5226; G11C 11/412

USPC .......................................................... 257/330
See application file for complete search history.

(56) References Cited

U.S. PATENT DOCUMENTS

| | | |
|---|---|---|
| 9,059,164 B2 | 6/2015 | Cheng et al. |
| 9,064,801 B1 | 6/2015 | Horak et al. |
| 9,306,032 B2 | 4/2016 | Lin et al. |
| 9,685,340 B2 | 6/2017 | Ok et al. |
| 9,704,760 B2 | 7/2017 | Ok et al. |
| 2016/0049394 A1* | 2/2016 | Shin ................... H01L 27/0886 257/401 |
| 2016/0293545 A1* | 10/2016 | Yoon ................. H01L 23/5283 |
| 2016/0372316 A1* | 12/2016 | Yang .................. H01L 27/0924 |
| 2017/0170266 A1 | 6/2017 | Horak et al. |
| 2017/0221891 A1 | 8/2017 | Chen et al. |

* cited by examiner

*Primary Examiner* — Tong-Ho Kim
(74) *Attorney, Agent, or Firm* — Harness, Dickey & Pierce, P.L.C.

(57) ABSTRACT

A semiconductor device includes a substrate including active patterns, a device isolation layer filling a trench between a pair of adjacent active patterns, a gate electrode on the active patterns, and a gate contact on the gate electrode. Each active pattern includes source/drain patterns at opposite sides of the gate electrode. The gate contact includes a first portion vertically overlapping with the gate electrode, and a second portion laterally extending from the first portion such that the second portion vertically overlaps with the device isolation layer and does not vertically overlap with the gate electrode. A bottom surface of the second portion is distal to the substrate in relation to a bottom surface of the first portion. The bottom surface of the second portion is distal to the substrate in relation to a top of a source/drain pattern that is adjacent to the second portion.

18 Claims, 25 Drawing Sheets

SEMICONDUCTOR DEVICES

CROSS-REFERENCE TO RELATED APPLICATION

This U.S. non-provisional patent application claims priority under 35 U.S.C. § 119 to Korean Patent Application No. 10-2017-0149280, filed on Nov. 10, 2017, in the Korean Intellectual Property Office, the disclosure of which is hereby incorporated by reference in its entirety.

BACKGROUND

Example embodiments of the inventive concepts relate to semiconductor devices and, more particularly, to semiconductor devices including a field effect transistor and a method of manufacturing the same.

Semiconductor devices are widely used in the electronics industry because of their small sizes, multi-functional characteristics, and/or low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices with excellent characteristics have been increasingly demanded with the development of the electronic industry. For example, high-reliable, high-speed, and/or multi-functional semiconductor devices have been increasingly demanded. To satisfy these demands, semiconductor devices have been highly integrated and structures of semiconductor devices have been more and more complicated.

SUMMARY

Example embodiments of the inventive concepts may provide a semiconductor device including a field effect transistor, which is capable of improving reliability.

In some example embodiments, a semiconductor device may include a substrate including a plurality of active patterns, a device isolation layer filling a trench between a pair of adjacent active patterns of the plurality of active patterns, a gate electrode on the plurality of active patterns, and a gate contact on the gate electrode. Each active pattern of the plurality of active patterns may include a separate source/drain pattern at each side of opposite sides of the gate electrode. The gate contact may include a first portion vertically overlapping with the gate electrode, and a second portion laterally extending from the first portion such that the second portion vertically overlaps with the device isolation layer and does not vertically overlap with the gate electrode. A bottom surface of the second portion may be distal to the substrate in relation to a bottom surface of the first portion, and the bottom surface of the second portion may be distal to the substrate in relation to a top of a source/drain pattern of the plurality of source/drain patterns that is adjacent to the second portion.

In some example embodiments, a semiconductor device may include a substrate including an active pattern extending in a first direction, a device isolation layer on the substrate, such that the device isolation layer defines at least one boundary of the active pattern, a gate electrode on the device isolation layer, the gate electrode intersecting the active pattern, the gate electrode extending in a second direction, and a gate contact on the gate electrode. The active pattern may include a source/drain pattern at one side of the gate electrode. The gate contact may include a first portion vertically overlapping with the gate electrode, and a second portion extending from the first portion in the first direction. A bottom surface of the second portion may be distal to the substrate in relation to a bottom surface of the first portion, and at least a portion of the source/drain pattern may vertically overlap with the second portion.

In some example embodiments, a semiconductor device may include a static random access memory (SRAM) cell on a substrate. The SRAM cell may include first and second access transistors, first and second pull-up transistors, and first and second pull-down transistors. A gate electrode of the first access transistor may be electrically connected to a word line through a gate contact and a via on the gate contact. The gate contact may include a first portion vertically overlapping with the gate electrode, and a second portion laterally extending from the first portion. The via may be on the second portion, and a bottom surface of the second portion may be distal to the substrate in relation to a bottom surface of the first portion.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
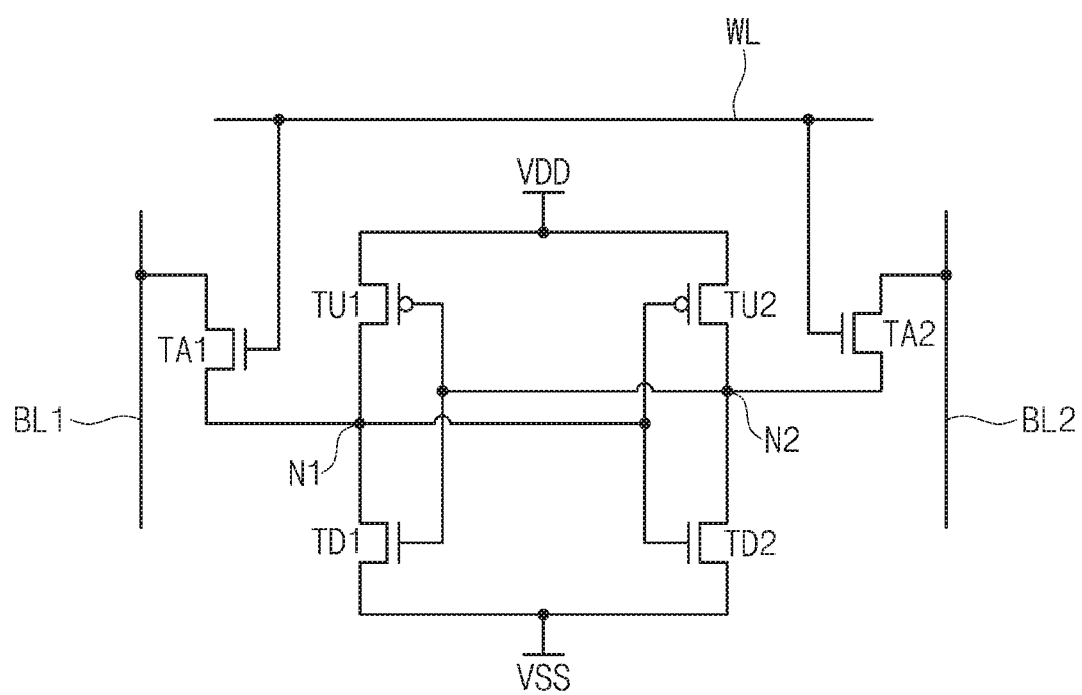
FIG. 1 is an equivalent circuit diagram of a static random access memory (SRAM) cell according to some example embodiments of the inventive concepts.

FIG. 1 is an equivalent circuit diagram of a static random access memory (SRAM) cell according to some example embodiments of the inventive concepts.

Referring to FIG. 1, a SRAM cell according to some example embodiments of the inventive concepts may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors. The first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line VDD, and a second source/drain of the first pull-down transistor TD1 may be connected to a ground line VSS. A gate of the first pull-up transistor TU1 may be electrically connected to a gate of the first pull-down transistor TD1. The first pull-up transistor TU1 and the first pull-down transistor TD1 may constitute a first inverter. The gates, connected to each other, of the first pull-up and first pull-down transistors TU1 and TD1 may correspond to an input terminal of the first inverter, and the first node N1 may correspond to an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line VDD, and a second source/drain of the second pull-down transistor TD2 may be connected to the ground line VSS. A gate of the second pull-up transistor TU2 may be electrically connected to a gate of the second pull-down transistor TD2. Thus, the second pull-up transistor TU2 and the second pull-down transistor TD2 may constitute a second inverter. The gates, connected to each other, of the second pull-up and second pull-down transistors TU2 and TD2 may correspond to an input terminal of the second inverter, and the second node N2 may correspond to an output terminal of the second inverter.

The first and second inverters may be coupled to each other to constitute a latch structure. In other words, the gates of the first pull-up and first pull-down transistors TU1 and TD1 may be electrically connected to the second node N2, and the gates of the second pull-up and second pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. Gates of the first and second access transistors TA1 and TA2 may be electrically connected to a word line WL through a gate contact GC as described further below, and a via V2 (also described further below) on the gate contact. Thus, the SRAM cell according to some example embodiments of the inventive concepts may be realized.

Figure 2:
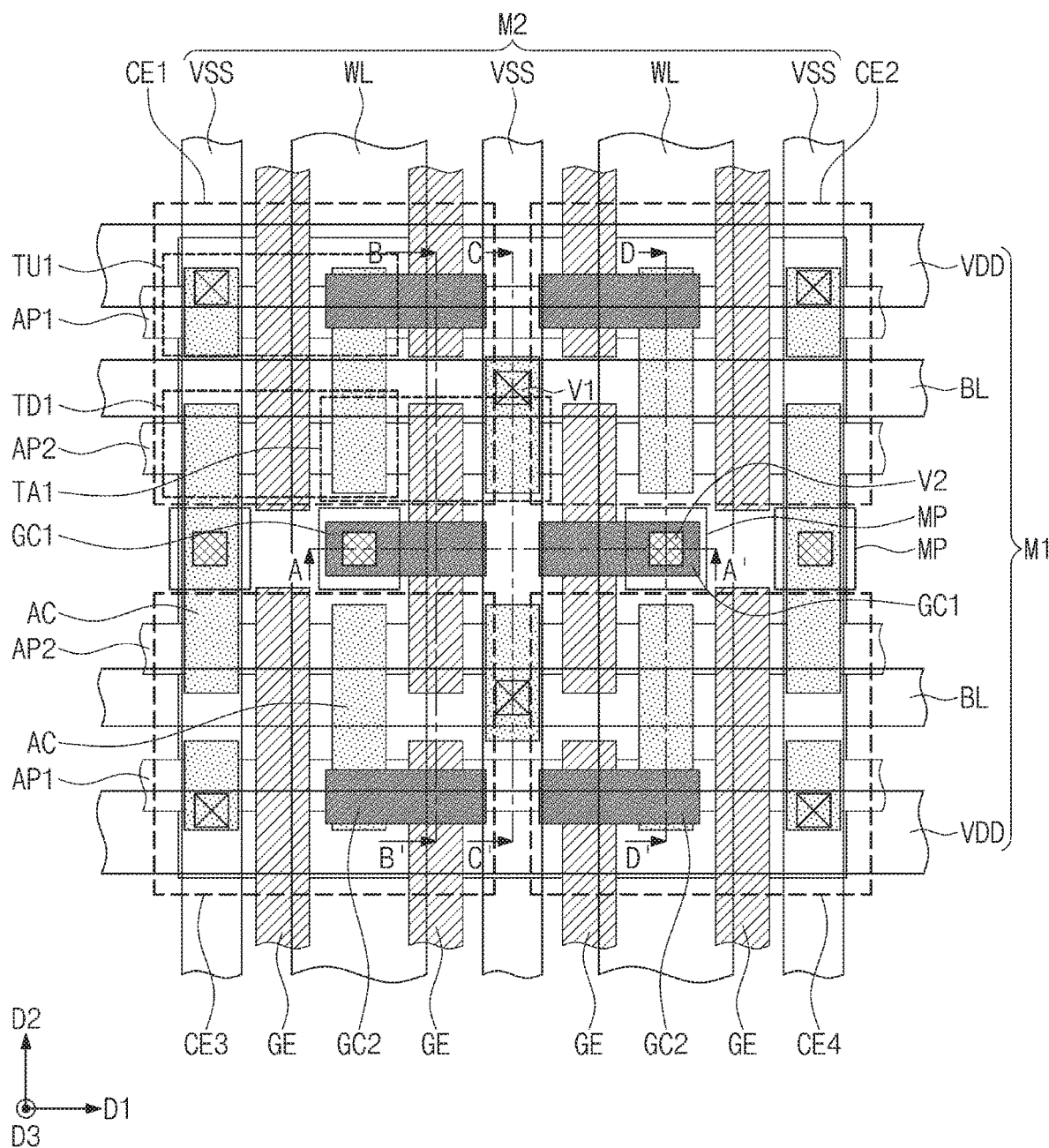
FIG. 2 is a plan view illustrating a semiconductor device according to some example embodiments of the inventive concepts.

FIG. 2 is a plan view illustrating a semiconductor device according to some example embodiments of the inventive concepts. FIGS. 3A to 3D are cross-sectional views taken along lines A-A', B-B', C-C' and D-D' of FIG. 2, respectively.

Referring to FIGS. 2 and 3A to 3D, SRAM cells CE1 to CE4 may be provided on a substrate 100. The SRAM cells CE1 to CE4 may include first to fourth SRAM cells CE1 to CE4 which are two-dimensionally arranged in a first direction D1 and a second direction D2. The first to fourth SRAM cells CE1 to CE4 may have mirror-symmetrical structures. Each of the first to fourth SRAM cells CE1 to CE4 may have the circuit of the SRAM cell described with reference to FIG. 1.

In detail, a device isolation layer ST may be provided on the substrate 100. The device isolation layer ST may define at least one boundary of the first and second active patterns AP1 and AP2 (collectively, a plurality of active patterns). The substrate 100 may be a semiconductor substrate including silicon, germanium, or silicon-germanium or may be a compound semiconductor substrate. The device isolation layer ST may include an insulating material such as a silicon oxide layer. In some example embodiments, first and second access transistors TA1 and TA2, first and second pull-up transistors TU1 and TU2, and first and second pull-down transistors TD1 and TD2 of an SRAM cell have active patterns AP1 and AP2, which have fin-shapes vertically protruding from a device isolation layer ST, as active regions.

The first and second active patterns AP1 and AP2 may be portions of the substrate 100. The first and second active patterns AP1 and AP2 may extend in parallel to each other in the first direction D1. As shown, the first and second active patterns AP1 and AP2 may be understood to be adjacent active patterns. A trench TR may be defined between the active patterns AP1 and AP2 adjacent to each other. As shown in at least FIG. 3B, the device isolation layer ST may fill the trench TR. Restated, the device isolation layer ST may fill a trench TR between a pair of adjacent active patterns AP1 and AP2. Upper portions of the first and second active patterns AP1 and AP2 may vertically protrude from the device isolation layer ST. Each of the upper portions of the first and second active patterns AP1 and AP2 may have a fin-shape vertically protruding from the device isolation layer ST. First channels CH1 and first source/drain patterns SD1 may be provided in the upper portions of the first active patterns AP1. Second channels CH2 and second source/drain patterns SD2 may be provided in the upper portions of the second active patterns AP2. The first source/drain patterns SD1 may be P-type dopant regions. The second source/drain patterns SD2 may be N-type dopant regions. Each of the first channels CH1 may be interposed between a pair of the first source/drain patterns SD1, and each of the second channels CH2 may be interposed between a pair of the second source/drain patterns SD2.

The first and second source/drain patterns SD1 and SD2 may include epitaxial patterns in the upper portions of the plurality of active patterns AP1 and AP2, where the epitaxial patterns may be formed by a selective epitaxial growth (SEG) process. Top surfaces of the first and second source/drain patterns SD1 and SD2 may be disposed at a higher level than top surfaces of the first and second channels CH1 and CH2. Each of the first and second source/drain patterns SD1 and SD2 may include a semiconductor element that is the same as or different from that of the substrate 100. In some example embodiments, the first source/drain patterns SD1 may include a semiconductor element of which a lattice constant is greater than that of the semiconductor element of the substrate 100. Thus, the first source/drain patterns SD1 may provide compressive stress to the first channels CH1. For example, the first source/drain patterns SD1 may include silicon-germanium (SiGe). In some example embodiments, the second source/drain patterns SD2 may include the same semiconductor element as the substrate 100. For example, the second source/drain patterns SD2 may include silicon (Si).

Gate electrodes GE may extend in the second direction D2 to intersect the first and second active patterns AP1 and AP2 (e.g., the second direction D2 intersects the first direction D1). Restated, and as shown in at least FIG. 3B, a gate electrode GE may be on the first and second active patterns AP1 and AP2. Each active pattern of active patterns AP1 and AP2 may include a separate source/drain pattern (e.g., SD1, SD2) at each side of opposite sides of the gate electrode GE. The gate electrodes GE may vertically overlap with the first and second channels CH1 and CH2. For example, the gate electrodes GE may include at least one of a conductive metal nitride (e.g., titanium nitride or tantalum nitride) or a metal material (e.g., titanium, tantalum, tungsten, copper, or aluminum).

An insulating pattern IP may be interposed between the gate electrodes GE which are aligned with each other in the second direction D2 and are adjacent to each other. The insulating pattern IP may isolate the adjacent gate electrodes GE from each other.

A pair of gate spacers GS may be disposed on both sidewalls of each of the gate electrodes GE, respectively. The gate spacers GS may extend along the gate electrodes GE in the second direction D2. Top surfaces of the gate spacers GS may be higher than top surfaces of the gate electrodes GE. The top surfaces of the gate spacers GS may be coplanar with a top surface of a first interlayer insulating layer 110 to be described later. The gate spacers GS may include at least one of $SiO_2$, SiCN, SiCON, or SiN. In certain embodiments, each of the gate spacers GS may have a multi-layered structure formed of at least two of $SiO_2$, SiCN, SiCON, or SiN.

Gate dielectric patterns GI may be interposed between the gate electrodes GE and the active patterns AP1 and AP2. Each of the gate dielectric patterns GI may extend along a bottom surface of each of the gate electrodes GE. Each of the gate dielectric patterns GI may cover a top surface and both sidewalls of each of the first and second channels CH1 and CH2. The gate dielectric patterns GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate capping pattern GP may be provided on each of the gate electrodes GE. The gate capping patterns GP may extend along the gate electrodes GE in the second direction D2. The gate capping pattern GP may be interposed between the pair of gate spacers GS. The gate capping patterns GP may include a material having an etch selectivity with respect to first to fourth interlayer insulating layers 110, 120, 130 and 140 to be described later. For example, the gate capping patterns GP may include at least one of SiON, SiCN, SiCON, or SiN.

A first interlayer insulating layer 110 may be provided on the substrate 100. The first interlayer insulating layer 110 may cover the gate spacers GS and the first and second source/drain patterns SD1 and SD2. The first interlayer insulating layer 110 may be between source/drain patterns SD1 and SD2 adjacent to each other in the second direction D2. The top surface of the first interlayer insulating layer 110 may be substantially coplanar (e.g., coplanar within manufacturing tolerances and/or material tolerances) with top surfaces of the gate capping patterns GP and the top surfaces of the gate spacers GS. A second portion P2 of a gate contact GC1, as described further below and as shown in at least FIG. 3D, may be isolated from direct contact with one or more source/drain patterns SD1 and SD2, and the interlayer insulating layer 110 may be between the second portion P2 and the one or more source/drain patterns SD1 and SD2. A second interlayer insulating layer 120 may be provided on the first interlayer insulating layer 110 to cover the top surfaces of the gate capping patterns GP and the top surfaces of the gate spacers GS.

Active contacts AC may be provided at both sides of each of the gate electrodes GE. The active contacts AC may penetrate the second interlayer insulating layer 120 and the first interlayer insulating layer 110 so as to be connected to the first and second source/drain patterns SD1 and SD2. Top surfaces of the active contacts AC may be substantially coplanar with a top surface of the second interlayer insulating layer 120. For example, the active contacts AC may include at least one of a conductive metal nitride (e.g., titanium nitride or tantalum nitride) or a metal material (e.g., titanium, tantalum, tungsten, copper, or aluminum).

First and second gate contacts GC1 and GC2 may be provided on ("may be on") the gate electrodes GE. Each of the first and second gate contacts GC1 and GC2 may penetrate the second interlayer insulating layer 120, the gate spacers GS and the gate capping pattern GP so as to be connected to the gate electrode GE. Top surfaces of the first and second gate contacts GC1 and GC2 may be substantially coplanar with the top surface of the second interlayer insulating layer 120. Bottom surfaces of the first and second gate contacts GC1 and GC2 may be higher than bottom surfaces of the active contacts AC.

Each of the first gate contacts GC1 may be provided on a gate electrode GE of the first access transistor TA1. Each of the first gate contacts GC1 may be electrically connected to a word line WL to be described later.

Each of the second gate contacts GC2 may be provided on a common gate electrode GE of the second pull-up and second pull-down transistors (not shown). The second gate contact GC2 may be connected to the active contact AC that is connected to the first source/drain of the first access transistor TA1, the first source/drain of the first pull-down transistor TD1, and the first source/drain of the first pull-up transistor TU1. In other words, the second gate contact GC2 may correspond to the first node N1 of FIG. 1.

For example, the first and second gate contacts GC1 and GC2 may include at least one of a conductive metal nitride (e.g., titanium nitride or tantalum nitride) or a metal material (e.g., titanium, tantalum, tungsten, copper, or aluminum). The first and second gate contacts GC1 and GC2 may include the same material as the active contacts AC. In some example embodiments, the second gate contact GC2 and the active contact AC connected thereto may constitute a single conductive structure.

A third interlayer insulating layer 130 may be provided on the second interlayer insulating layer 120, and a fourth interlayer insulating layer 140 may be provided on the third interlayer insulating layer 130. For example, each of the first to fourth interlayer insulating layers 110, 120, 130 and 140 may include a silicon oxide layer.

First interconnection lines M1 constituting a first interconnection layer may be disposed in the third interlayer insulating layer 130. The first interconnection lines M1 may include bit lines BL and power lines VDD, which extend in the first direction D1. First vias V1 may be disposed in the third interlayer insulating layer 130. Some of the first vias V1 may electrically connect the bit lines BL to some of the active contacts AC, and others of the first vias V1 may electrically connect the power lines VDD to others of the active contacts AC. A first via V1 may be on the second portion P2 of the first gate contact GC1.

The first interconnection lines M1 may further include conductive patterns MP that are provided on some of the active contacts AC and the first gate contacts GC1. The first via V1 may be interposed between the first gate contact GC1 and the conductive pattern MP corresponding thereto. The first via V1 may be interposed between the active contact AC and the conductive pattern MP corresponding thereto.

In some example embodiments, each of the first vias V1 may be connected to a corresponding component (e.g., the bit line BL, the power line VDD, or the conductive pattern MP) as a single unitary body. In other words, the first vias V1, the bit lines BL, the power lines VDD and the conductive patterns MP may be formed by a dual damascene process.

Second interconnection lines M2 constituting a second interconnection layer may be disposed in the fourth interlayer insulating layer 140. The second interconnection lines M2 may include word lines WL and ground lines VSS, which extend in the second direction D2. Second vias V2 may be disposed in the fourth interlayer insulating layer 140 and, as shown in at least FIG. 3D, may be on a second portion P2 of a gate contact GC.

The second vias V2 may electrically connect the second interconnection lines M2 to the first interconnection lines M1. In more detail, one of the second vias V2 may be interposed between the conductive pattern MP and the word line WL to electrically connect the conductive pattern MP and the word line WL. The gate electrode GE of the first access transistor TA1 in each of the first to fourth SRAM cells CE1 to CE4 may be electrically connected to the word line WL through the first gate contact GC1, the first via V1, the conductive pattern MP, and the second via V2. Another of the second vias V2 may be interposed between the conductive pattern MP and the ground line VSS to electrically connect the conductive pattern MP and the ground line VSS. The second source/drain of the first pull-down transistor TD1 in each of the first to fourth SRAM cells CE1 to CE4 may be electrically connected to the ground line VSS through the active contact AC, the first via V1, the conductive pattern MP, and the second via V2.

In some example embodiments, each of the second vias V2 may be connected to a corresponding component (i.e., the word line WL or the ground line VSS) as a single unitary body. In other words, the second vias V2, the word lines WL and the ground lines VSS may be formed by a dual damascene process.

The first and second active patterns AP1 and AP2 and the gate electrodes GE may include memory transistors of a static random access memory (SRAM) cell. In detail, the memory transistors in each of the first to fourth SRAM cells CE1 to CE4 of FIG. 2 may include the first access transistor TA1, the first pull-up transistor TU1, and the first pull-down transistor TD1, described above with reference to FIG. 1. In addition, even though not shown in the drawings, each of the first to fourth SRAM cells CE1 to CE4 may include the second pull-up transistor, the second pull-down transistor, and the second access transistor.

The first access transistor TA1 of the first SRAM cell CE1 and the first access transistor TA1 of the third SRAM cell CE3 may be connected to one of the word lines WL through one gate electrode GE. The first access transistor TA1 of the second SRAM cell CE2 and the first access transistor TA1 of the fourth SRAM cell CE4 may be connected to another of the word lines WL through one gate electrode GE.

The first pull-down transistor TD1 of the first SRAM cell CE1 and the first pull-down transistor TD1 of the third SRAM cell CE3 may be connected to one of the ground lines VSS through one active contact AC. The first pull-down transistor TD1 of the second SRAM cell CE2 and the first pull-down transistor TD1 of the fourth SRAM cell CE4 may be connected to another of the ground lines VSS through one active contact AC.

The second source/drain of the first pull-up transistor TU1 in each of the first to fourth SRAM cells CE1 to CE4 may be electrically connected to a corresponding one of the power lines VDD through the active contact AC and the first via V1.

The second source/drain of the first access transistor TA1 in each of the first to fourth SRAM cells CE1 to CE4 may be electrically connected to a corresponding one of the bit lines BL through the active contact AC and the first via V1.

Figure 3A:
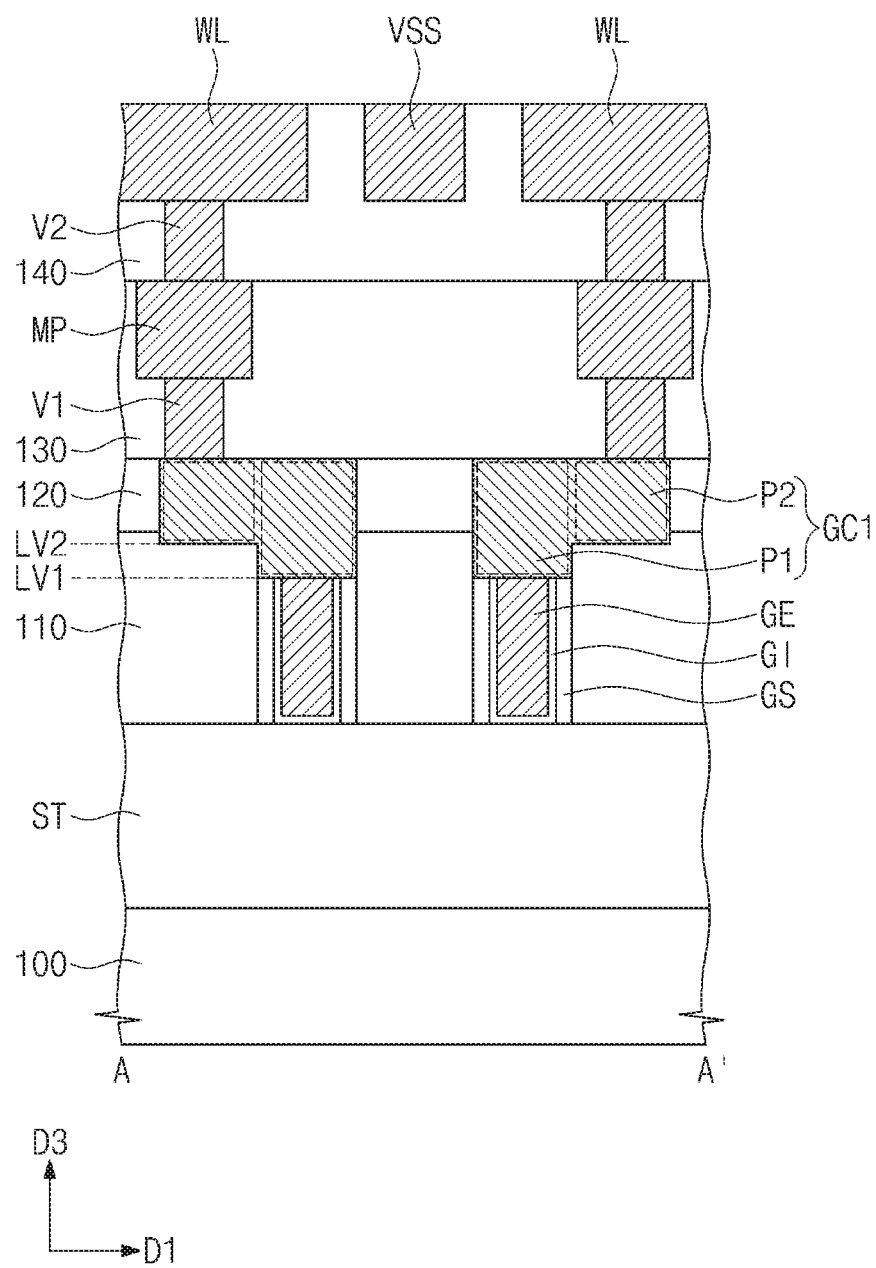
FIGS. 3A to 3D are cross-sectional views taken along lines A-A', B-B', C-C' and D-D' of FIG. 2, respectively.

Hereinafter, the first gate contact GC1 will be described in more detail with reference to FIGS. 3A and 3D. The first gate contact GC1 may include a first portion P1 vertically overlapping with the gate electrode GE and a second portion P2 laterally extending from the first portion P1 such that the second portion P2 vertically overlaps with the device isolation layer ST and does not vertically overlap with the gate electrode GE. The second portion P2 may extend from the first portion P1 in parallel to the first direction D1. The first portion P1 may vertically overlap with at least one of the gate spacers GS as well as the gate electrode GE. The second portion P2 may vertically overlap with the device isolation layer ST. The first interlayer insulating layer 110 may be interposed between the second portion P2 and the device isolation layer ST. The second portion P2 may be on the first interlayer insulating layer 110. The first via V1 on the first gate contact GC1 may be provided on the second portion P2.

A bottom surface of the first portion P1 may be disposed at a first level LV1, and a bottom surface of the second portion P2 may be disposed at a second level LV2. The second level LV2 may be higher than the first level LV1. Restated, a bottom surface of the second portion P2 may be distal to the substrate 100 in relation to a bottom surface of the first portion P1. In some example embodiments, a bottom surface of the first gate contact GC1 may have a stepped profile at a boundary between the first portion P1 and the second portion P2. The second level LV2 may be lower than (e.g., proximate to substrate 100 in relation to) the top surface of the first interlayer insulating layer 110.

Figure 3B:
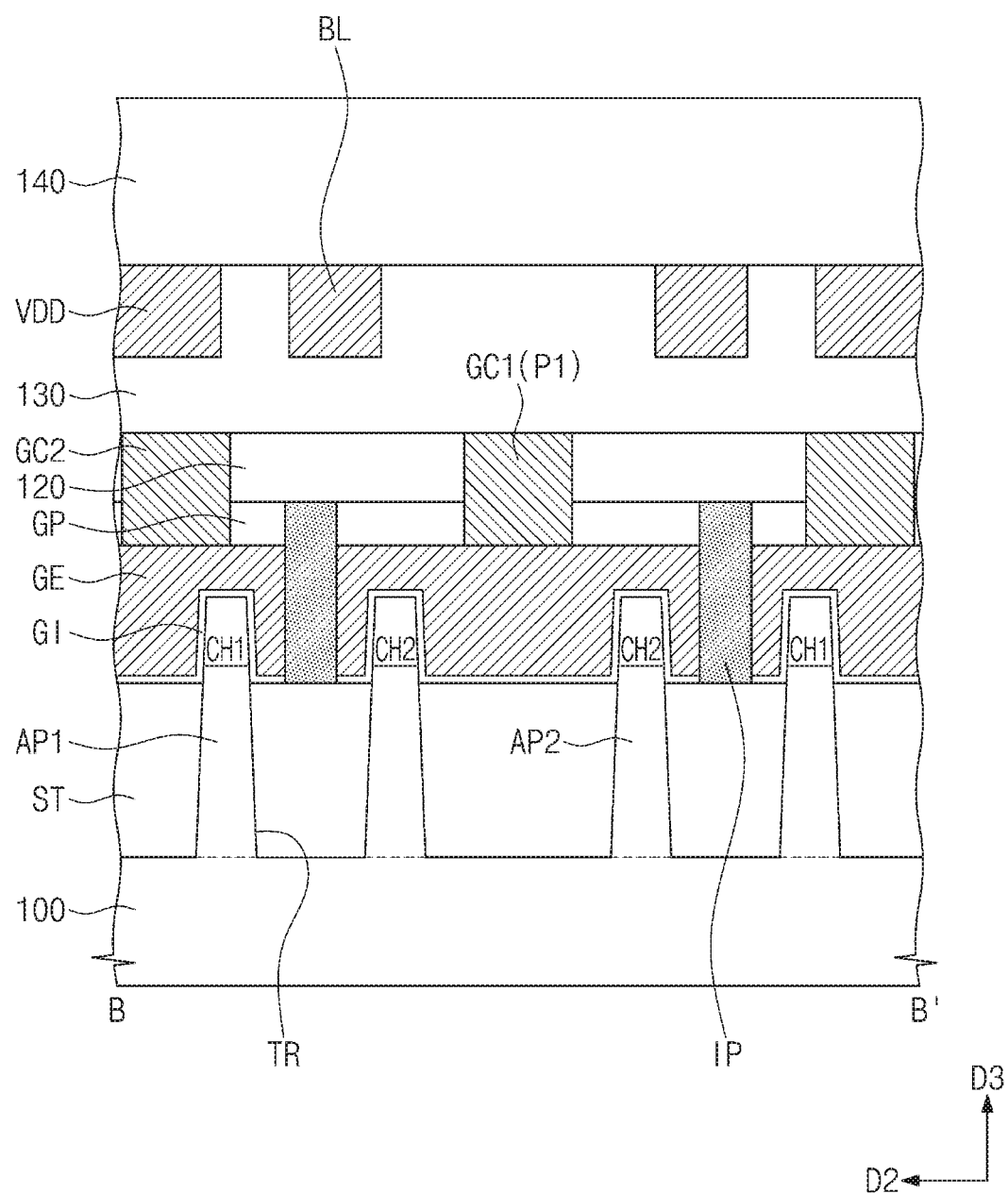
Figure 3C:
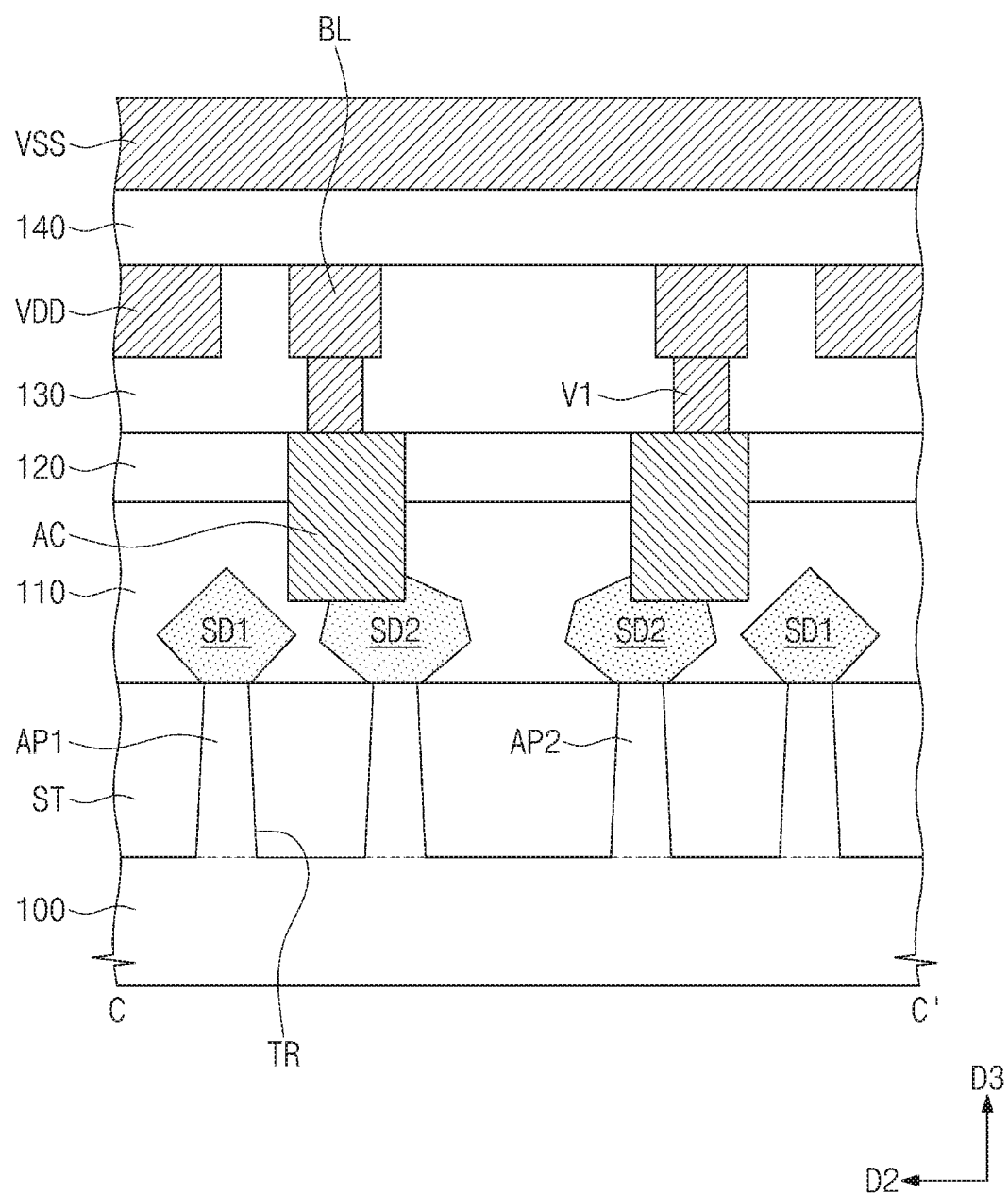
Figure 3D:
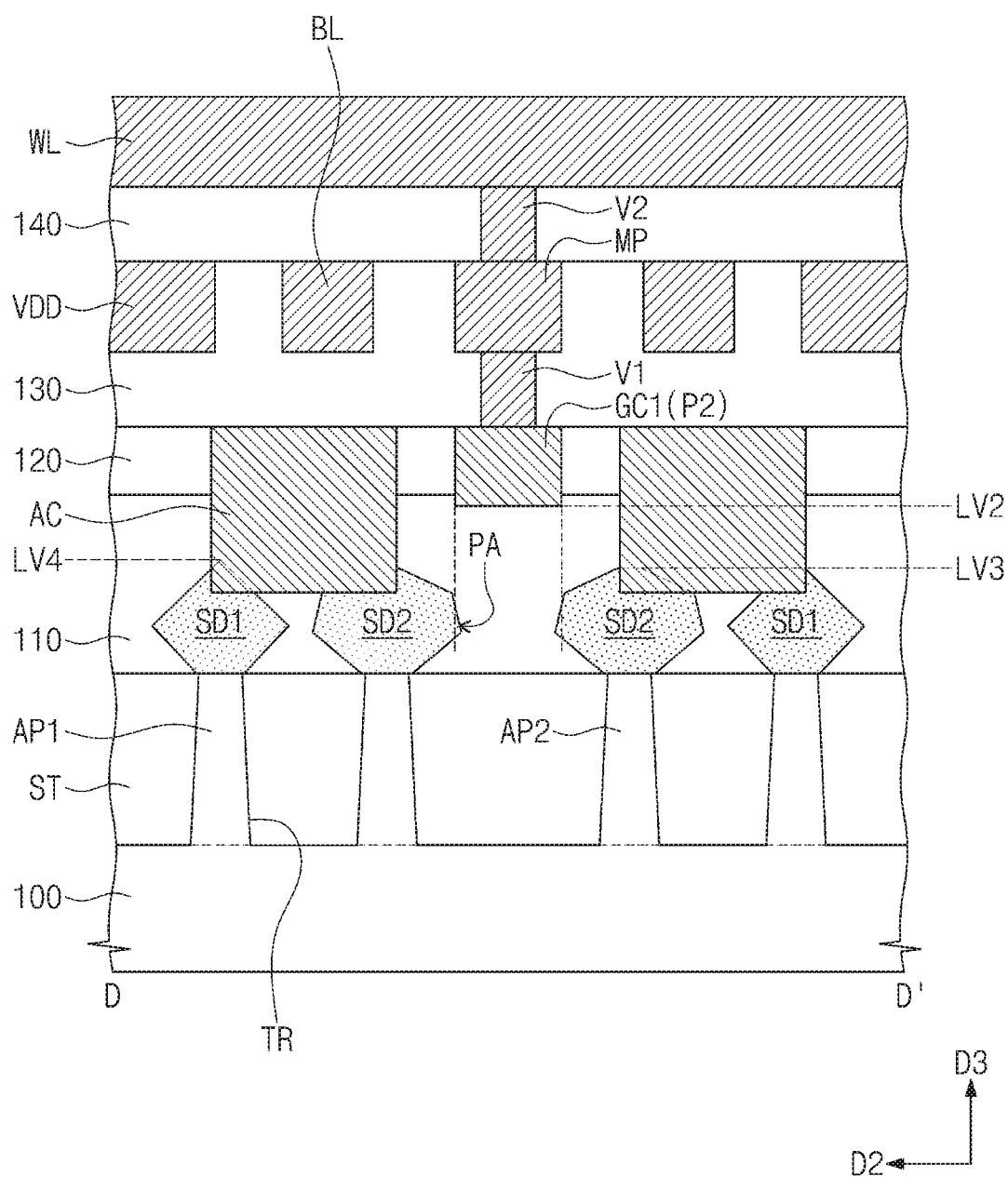

The second portion P2 may extend onto the first interlayer insulating layer 110 between the second source/drain patterns SD2 adjacent to each other (see FIG. 3D). A top of each of the second source/drain patterns SD2 may be disposed at a third level LV3, and a top of each of the first source/drain patterns SD1 may be disposed at a fourth level LV4. The second level LV2 which is the level of the bottom surface of the second portion P2 may be higher than the third level LV3 and may also be higher than the fourth level LV4. Restated, the bottom surface of the second portion P2 may be distal to the substrate 100 in relation to a top of a source/drain pattern that is adjacent to the second portion P2.

At least a portion PA of each of the second source/drain patterns SD2 that is adjacent to each other may vertically overlap with the second portion P2. If the bottom surface of the second portion P2 is lower than the bottom surface of the first portion P1, the bottom surface of the second portion P2 may be disposed at a similar level to a bottom surface of the active contact AC. In this case, the second portion P2 may be in contact with the at least a portion PA of the second source/drain pattern SD2 to cause an electrical short.

However, according to some example embodiments of the inventive concepts, since the second level LV2 of the bottom surface of the second portion P2 is higher than the third level LV3, the second portion P2 may not be in contact with the at least a portion PA of the second source/drain pattern SD2. As a result, it is possible to prevent an electrical short between the first gate contact GC1 and the second source/drain patterns SD2.

Figure 4:
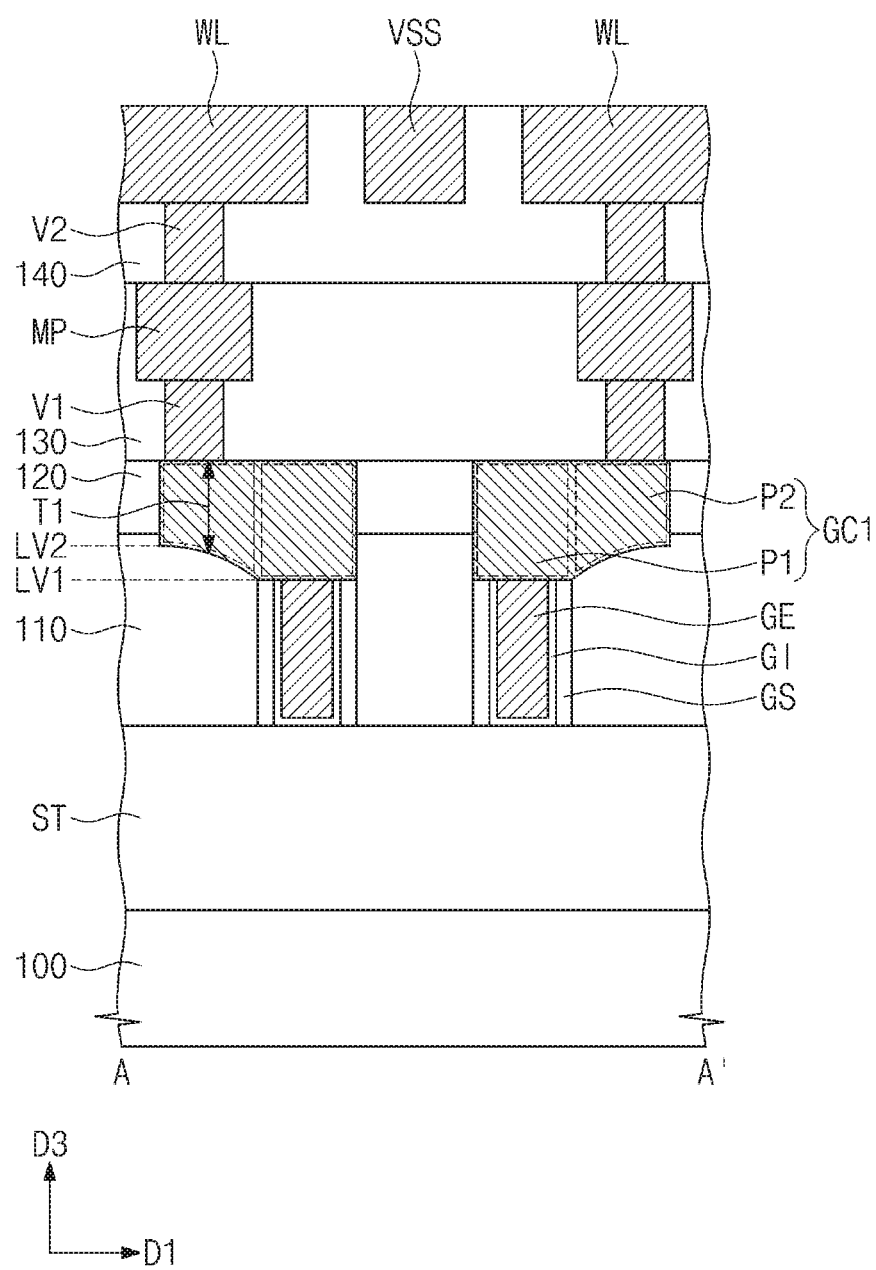
FIG. 4 is a cross-sectional view taken along the line A-A' of FIG. 2 to illustrate a semiconductor device according to some example embodiments of the inventive concepts.

FIG. 4 is a cross-sectional view taken along the line A-A' of FIG. 2 to illustrate a semiconductor device according to some example embodiments of the inventive concepts. In some example embodiments, the descriptions to the same technical features as in the embodiments of FIGS. 2 and 3A to 3D will be omitted for the purpose of ease and convenience in explanation. In other words, differences between some example embodiments and the embodiments of FIGS. 2 and 3A to 3D will be mainly described hereinafter.

Referring to FIGS. 2 and 4, the first gate contact GC1 may include a first portion P1 vertically overlapping with the gate electrode GE and a second portion P2 laterally extending from the first portion P1. The highest level of a bottom surface of the second portion P2 may be the second level LV2. A level of the bottom surface of the second portion P2 may become lower toward the first portion P1. In other words, a vertical thickness T1 of the second portion P2 may decrease as a horizontal distance from the first portion P1 increases. Restated, a vertical thickness T1 of the second portion P2 may be inversely proportional to a horizontal distance from the first portion P1. A top surface of the first portion P1 and a top surface of the second portion P2 may be flat. The top surface of the first portion P1 and the top surface of the second portion P2 may be coplanar with the top surface of the second interlayer insulating layer 120.

Figure 5:
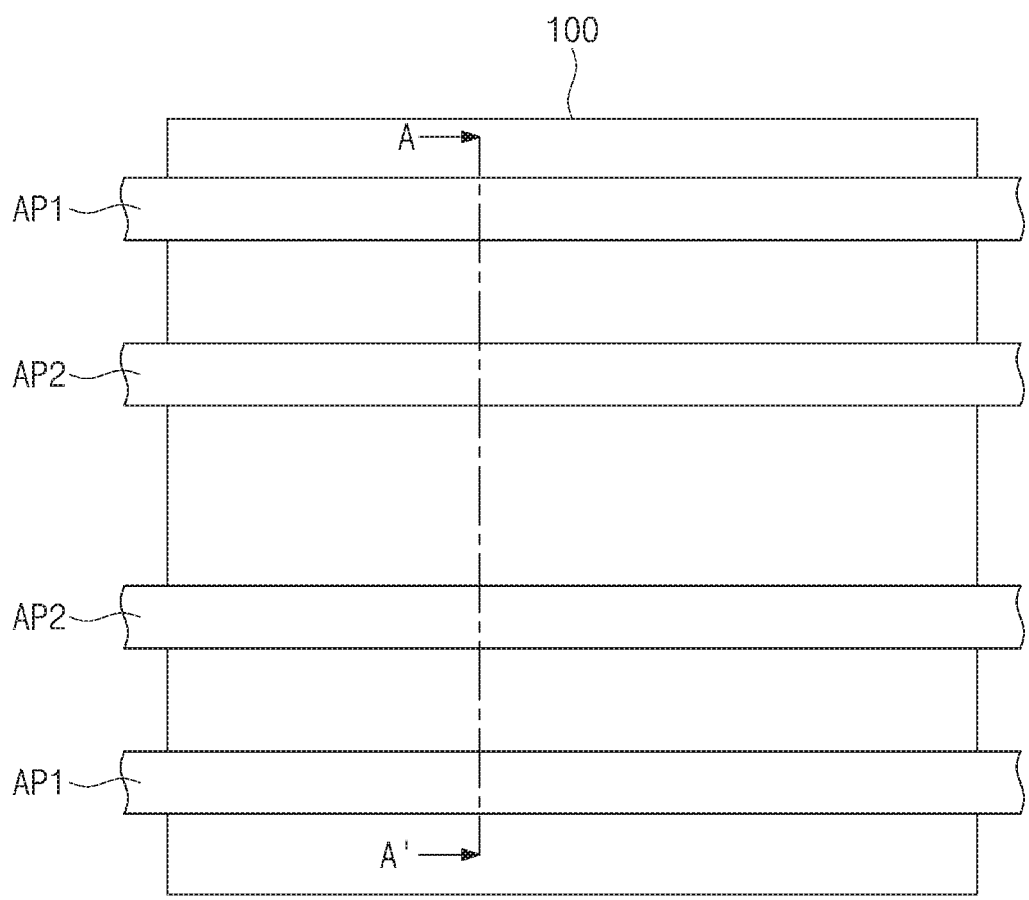
FIGS. 5, 7, and 9 are plan views illustrating a method of manufacturing a semiconductor device according to some example embodiments of the inventive concepts.
Figure 6:
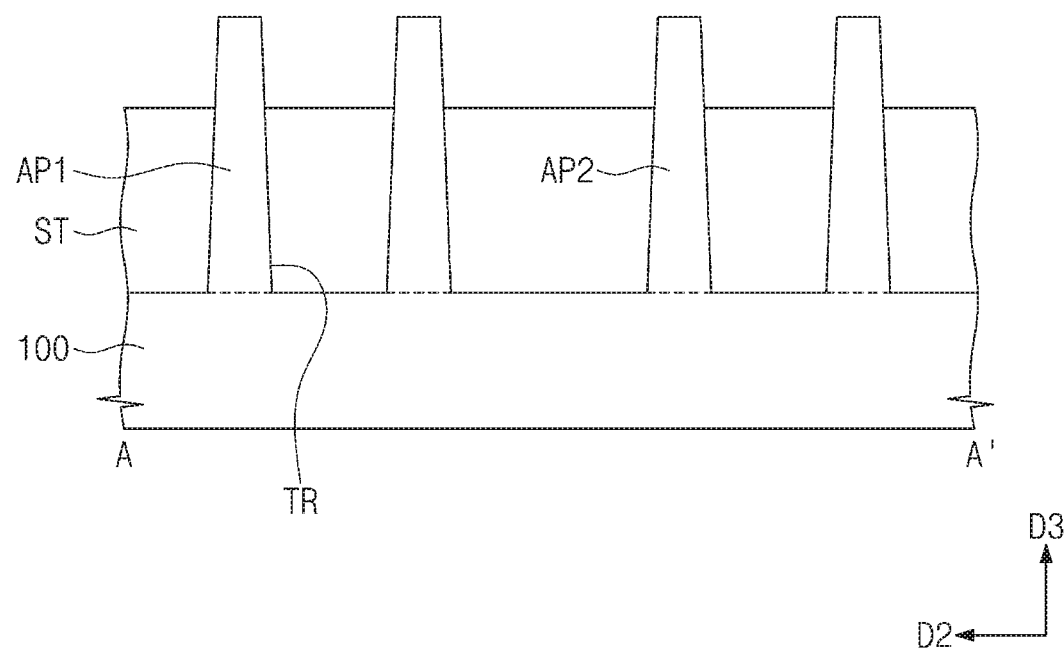
FIGS. 6, 8A, and 10A are cross-sectional views taken along lines A-A' of FIGS. 5, 7, and 9, respectively.
Figure 7:
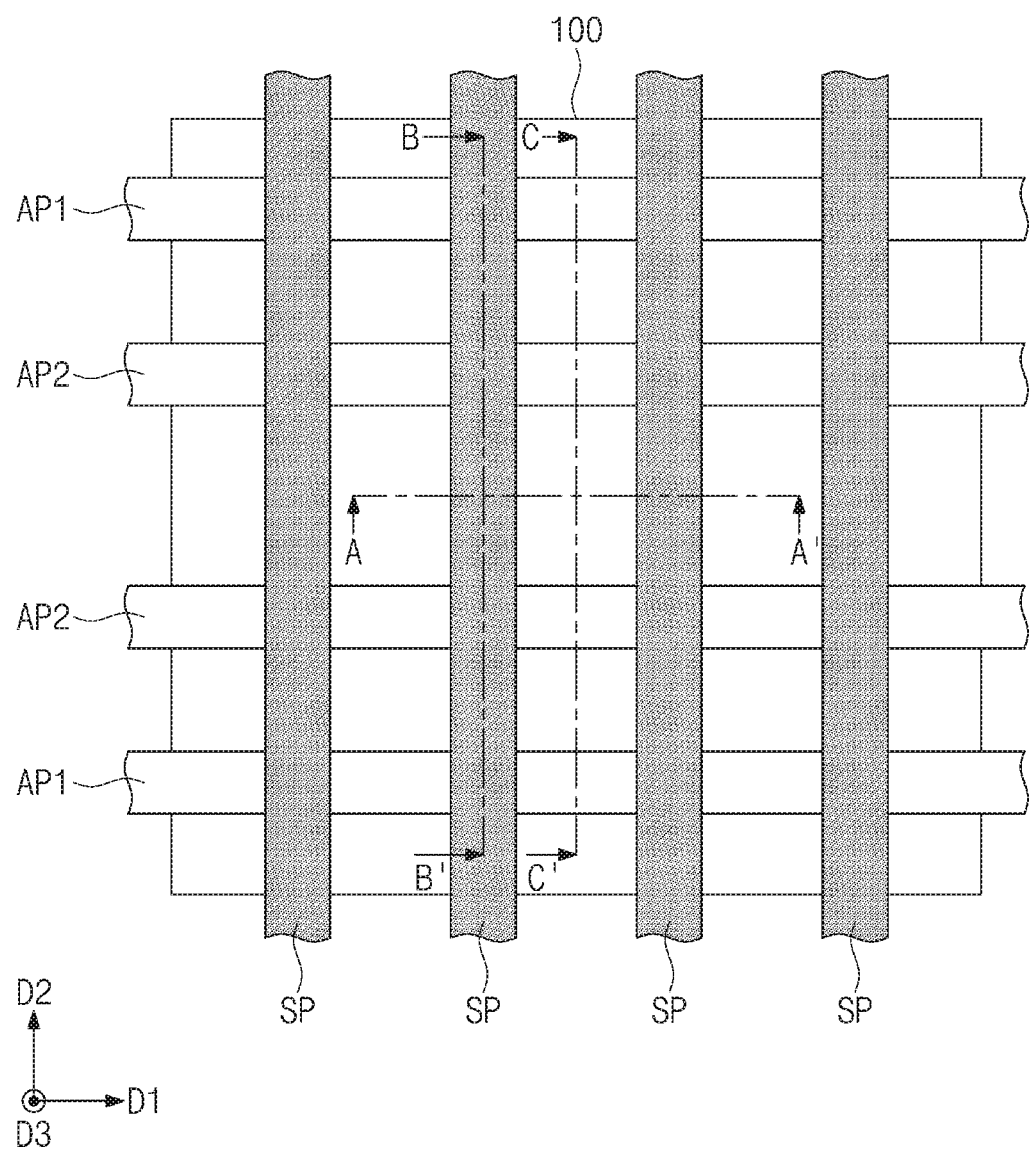
Figure 8A:
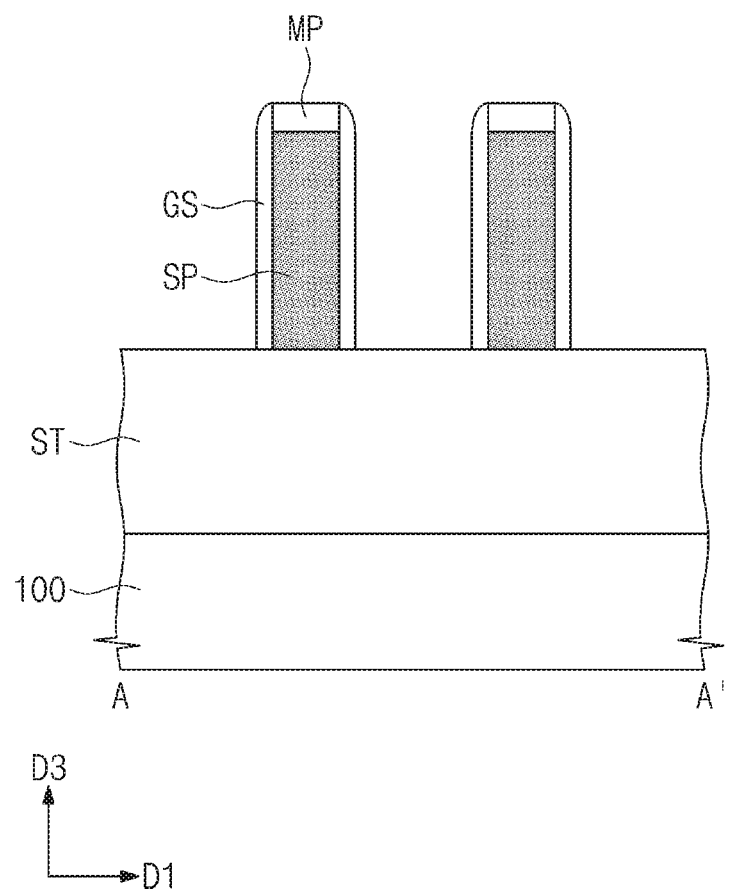
Figure 8B:
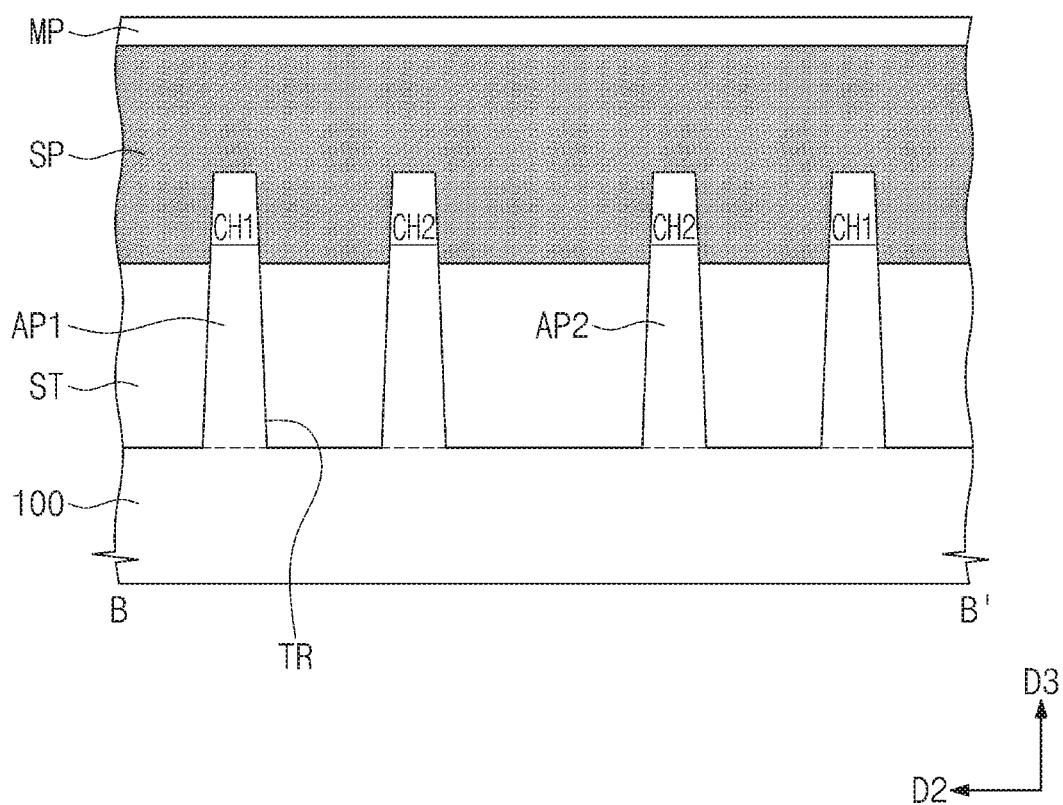
FIGS. 8B and 10B are cross-sectional views taken along lines B-B' of FIGS. 7 and 9, respectively.
Figure 8C:
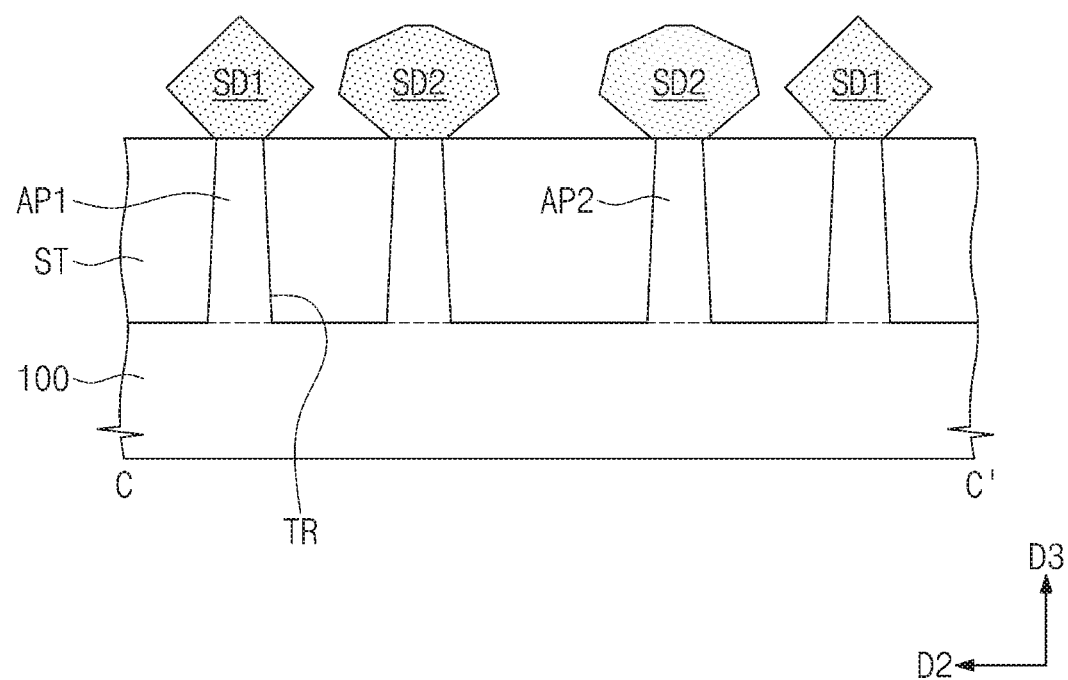
FIGS. 8C and 10C are cross-sectional views taken along lines C-C' of FIGS. 7 and 9, respectively.
Figure 9:
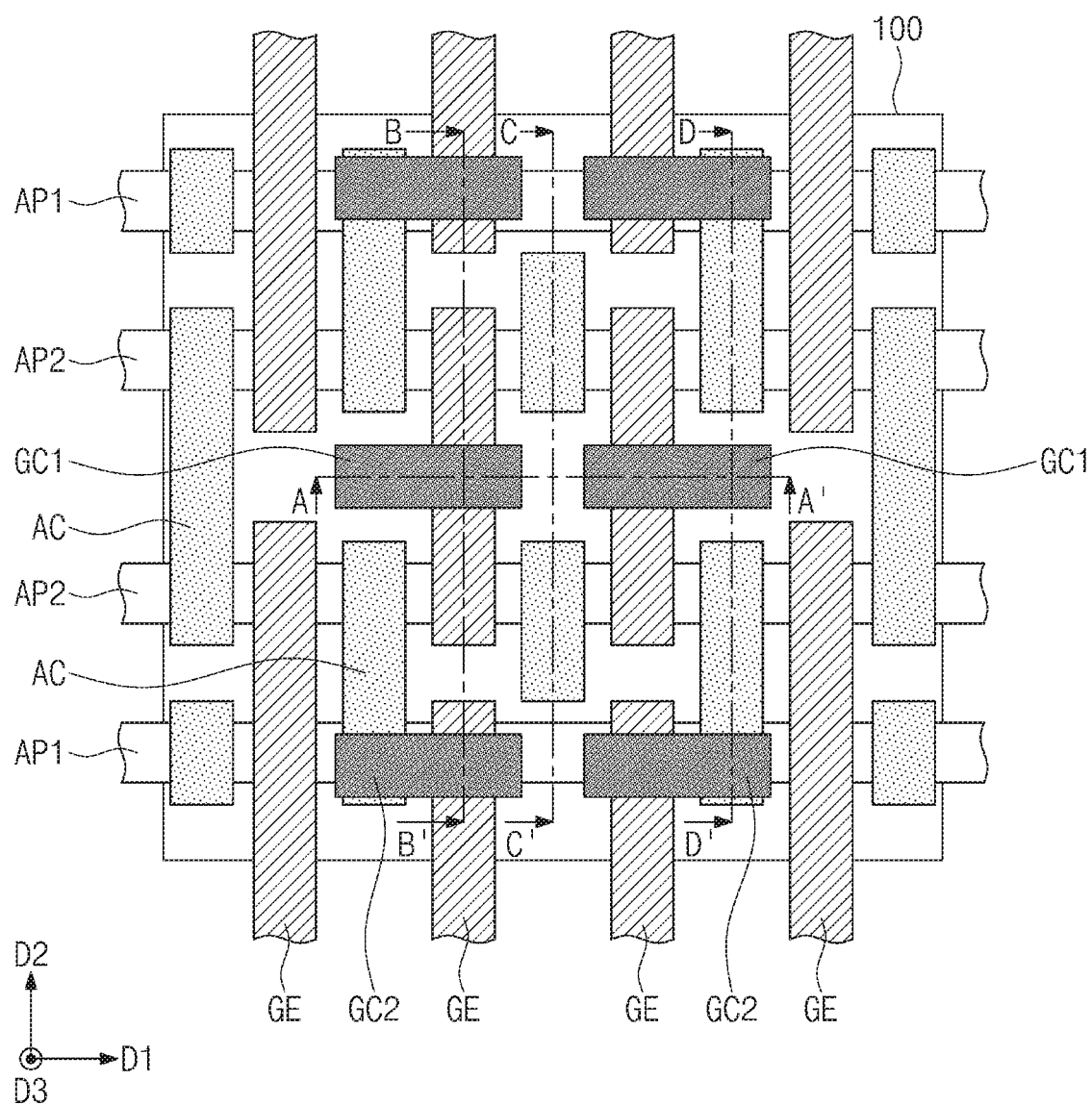
Figure 10A:
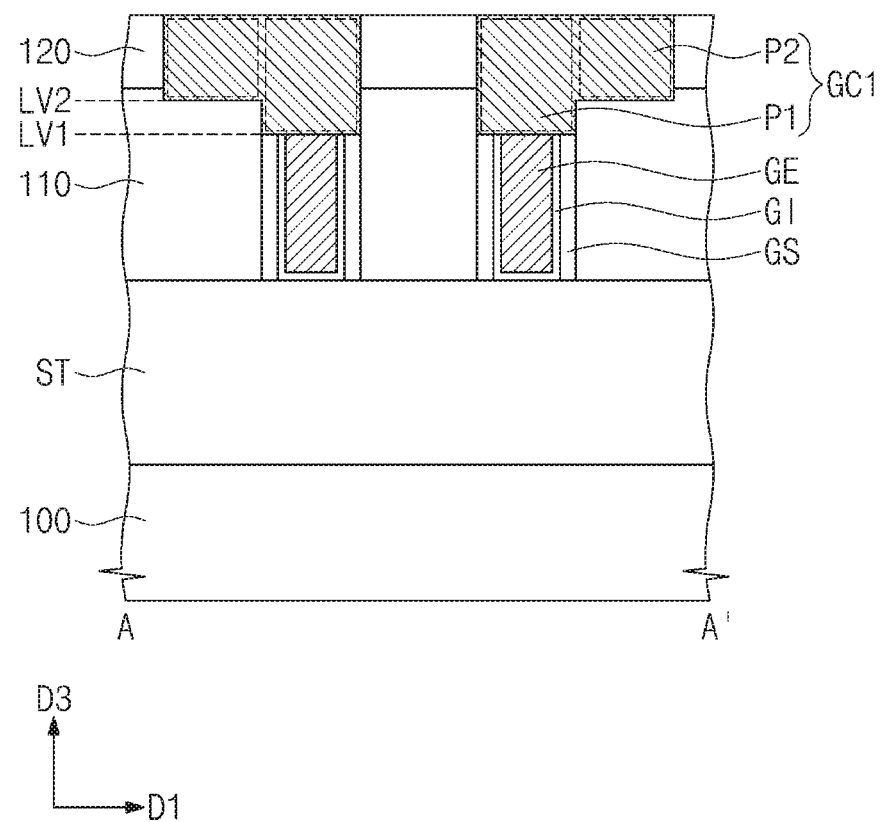
Figure 10B:
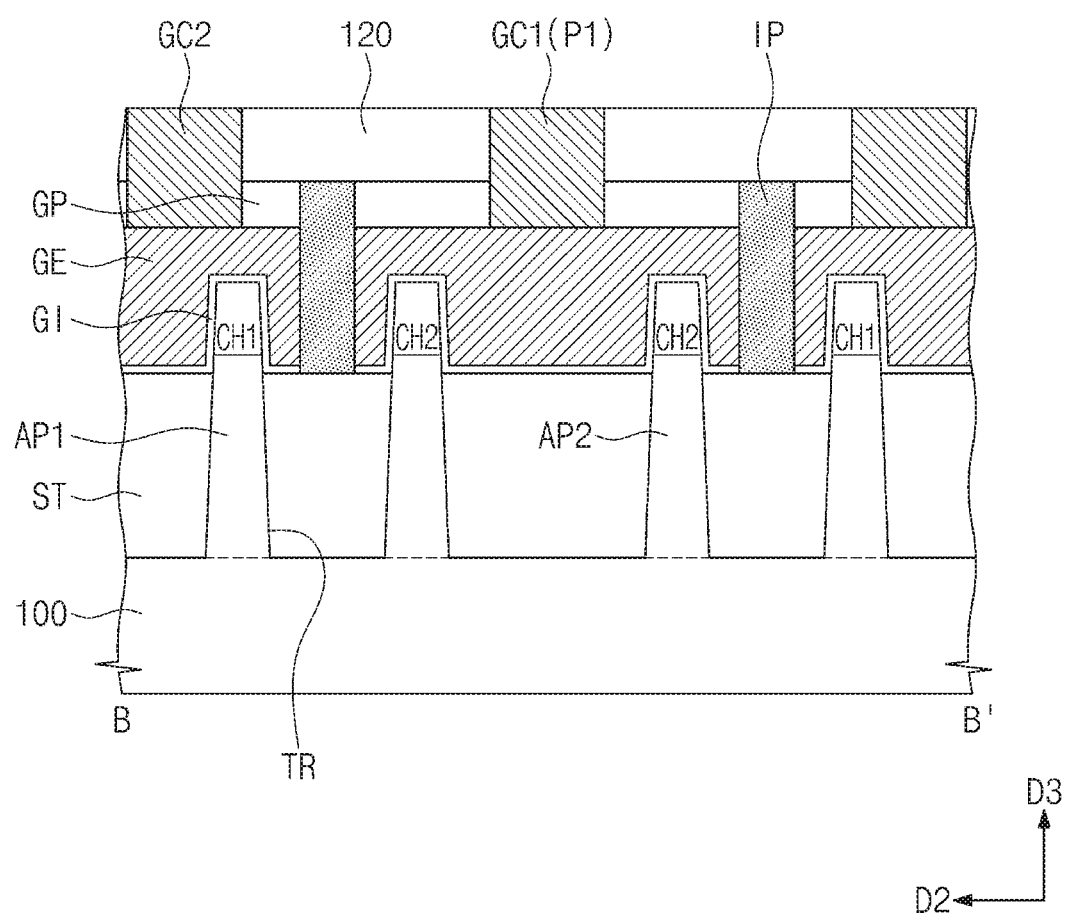
Figure 10C:
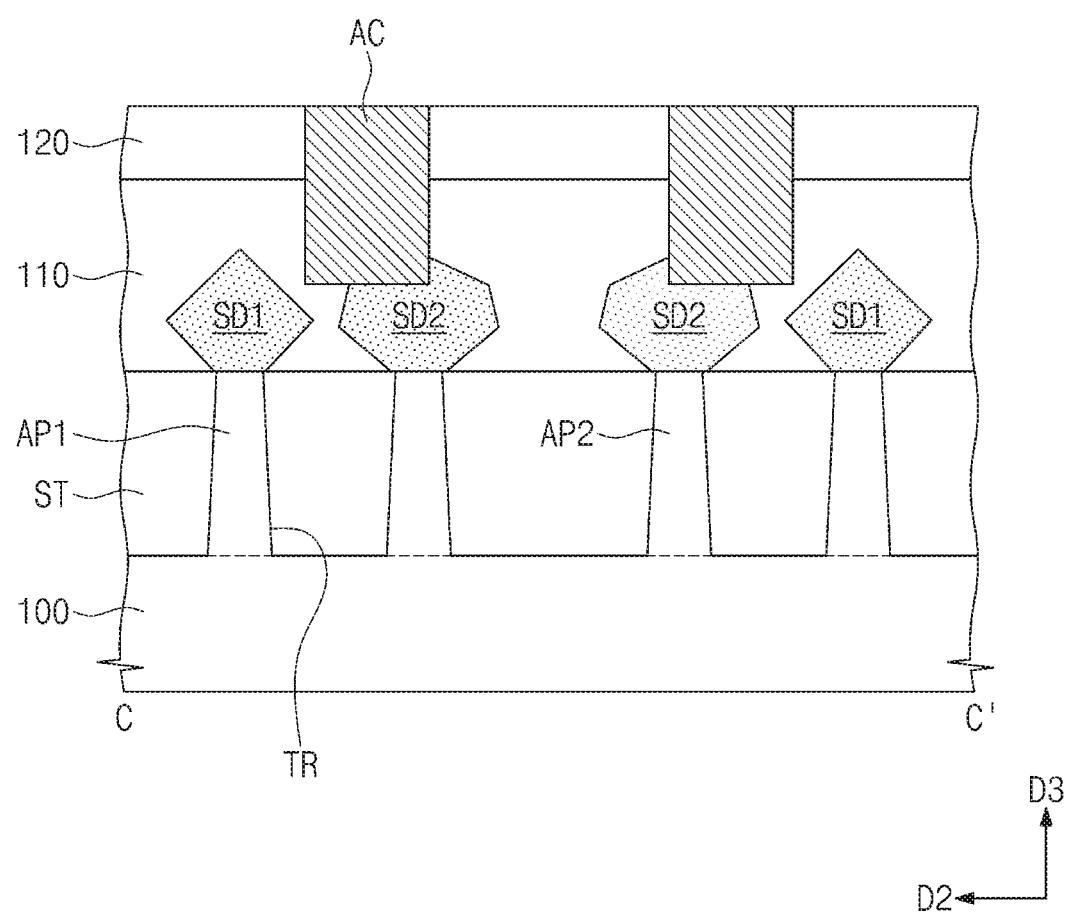
Figure 10D:
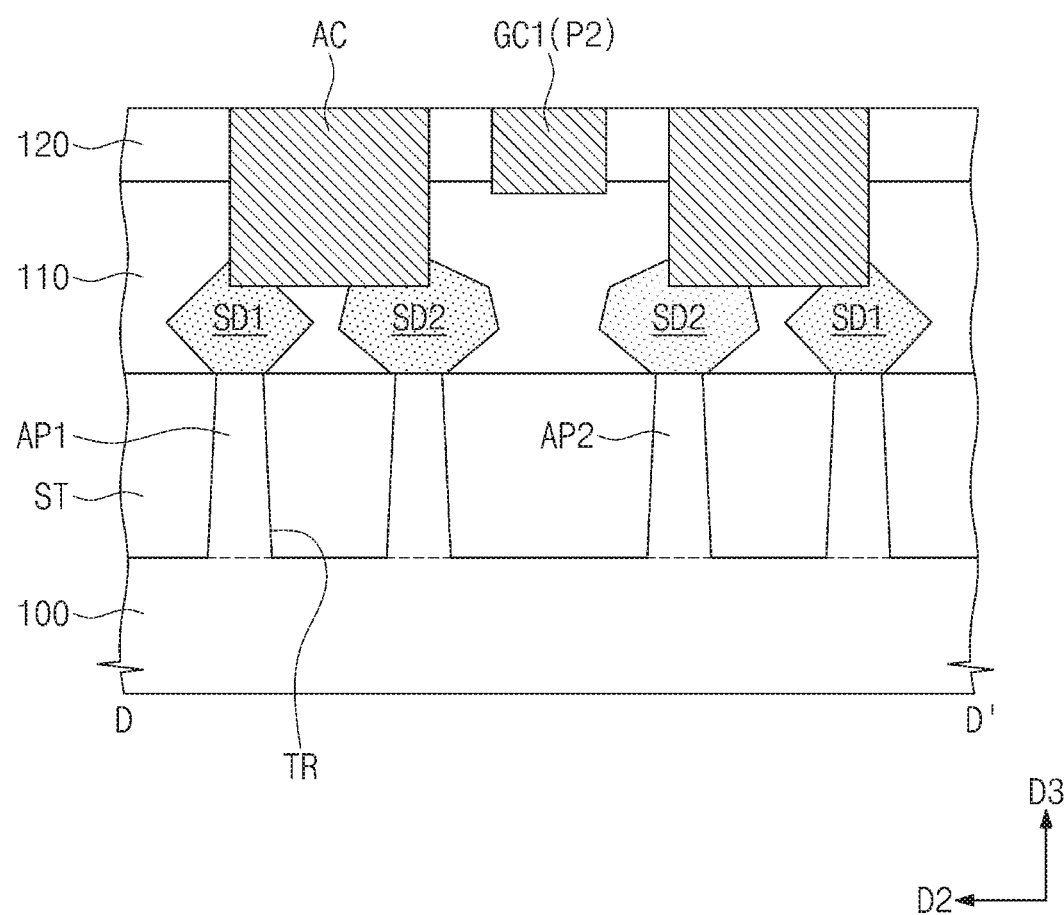
FIG. 10D is a cross-sectional view taken along a line D-D' of FIG. 9.
Figure 11:
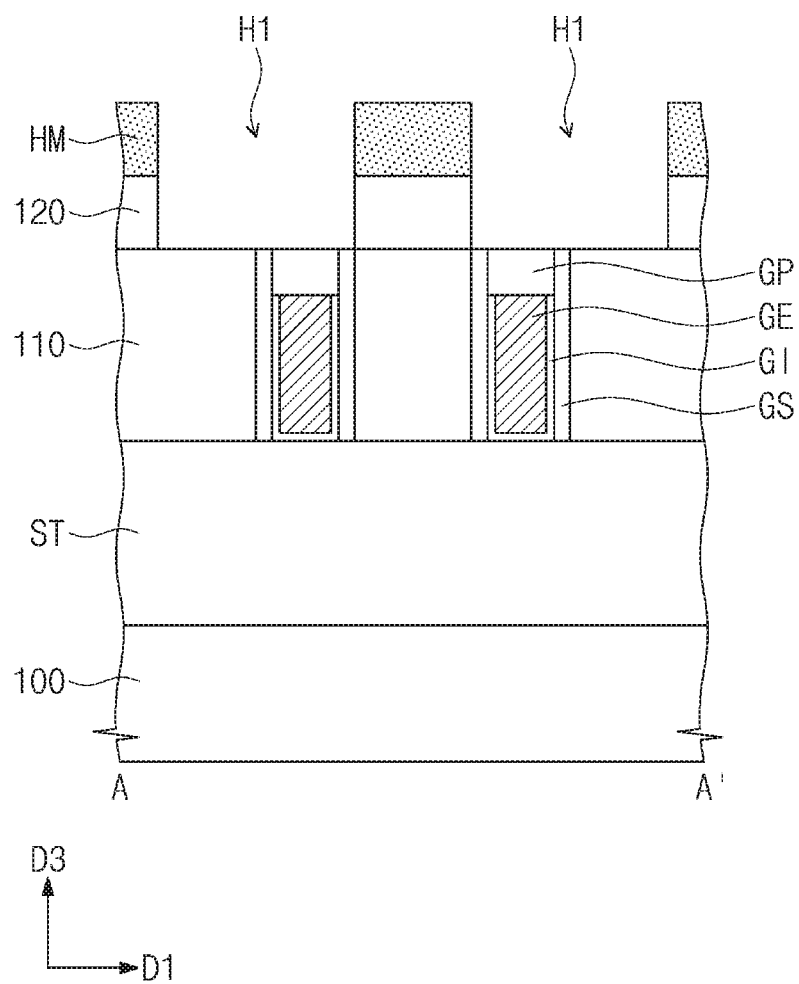
FIGS. 11 and 12 are cross-sectional views taken along the line A-A' of FIG. 9 to illustrate a method of forming a gate contact according to some example embodiments of the inventive concepts.
Figure 12:
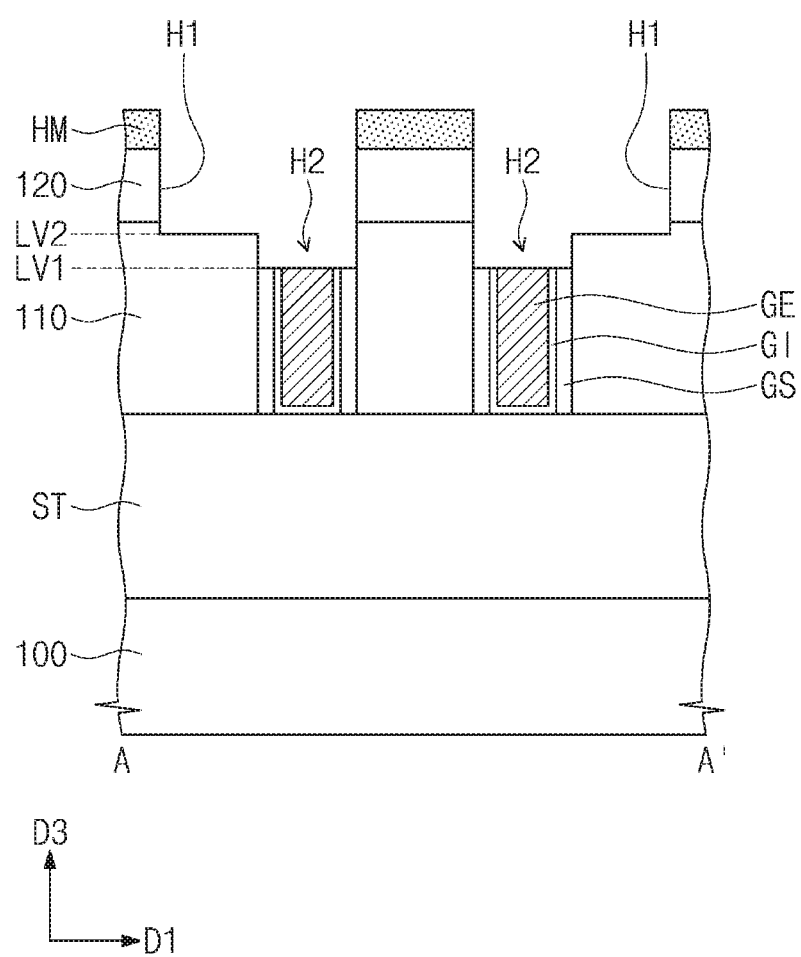

FIGS. 5, 7, and 9 are plan views illustrating a method of manufacturing a semiconductor device according to some example embodiments of the inventive concepts. FIGS. 6, 8A, and 10A are cross-sectional views taken along lines A-A' of FIGS. 5, 7, and 9, respectively. FIGS. 8B and 10B are cross-sectional views taken along lines B-B' of FIGS. 7 and 9, respectively. FIGS. 8C and 10C are cross-sectional views taken along lines C-C' of FIGS. 7 and 9, respectively. FIG. 10D is a cross-sectional view taken along a line D-D' of FIG. 9. FIGS. 11 and 12 are cross-sectional views taken along the line A-A' of FIG. 9 to illustrate a method of forming a gate contact according to some example embodiments of the inventive concepts.

Referring to FIGS. 5 and 6, a substrate 100 may be patterned to form first and second active patterns AP1 and AP2. In some example embodiments, mask patterns may be formed on the substrate 100 and the substrate 100 may be anisotropically etched using the mask patterns as etch masks to form the first and second active patterns AP1 and AP2. A trench TR may be formed between a pair of the active patterns AP1 and AP2 adjacent to each other. The substrate 100 may be a semiconductor substrate including silicon, germanium, or silicon-germanium or may be a compound semiconductor substrate.

Device isolation layers ST may be formed in the trenches TR. In detail, an insulating layer (e.g., a silicon oxide layer) may be formed to fill the trenches TR. Thereafter, the insulating layer may be recessed until upper portions of the first and second active patterns AP1 and AP2 are exposed, thereby forming the device isolation layers ST.

Referring to FIGS. 7 and 8A to 8C, sacrificial patterns SP may be formed to intersect the first and second active patterns AP1 and AP2. The sacrificial patterns SP may have line shapes extending in the second direction D2. In detail, the formation of the sacrificial patterns SP may include forming a sacrificial layer on an entire top surface of the substrate 100, forming mask patterns MP on the sacrificial layer, and patterning the sacrificial layer using the mask patterns MP as etch masks. The sacrificial layer may include a poly-silicon layer.

A pair of gate spacers GS may be formed on both sidewalls of each of the sacrificial patterns SP, respectively. The formation of the gate spacers GS may include conformally forming a spacer layer on an entire top surface of the substrate 100 and anisotropically etching the spacer layer. For example, the spacer layer may include at least one of $SiO_2$, SiCN, SiCON, or SiN. In an embodiment, the spacer layer may be formed of a multi-layer including at least two of $SiO_2$, SiCN, SiCON, or SiN.

Source/drain patterns SD1 and SD2 may be formed at both sides of each of the sacrificial patterns SP. First source/drain patterns SD1 may be formed at the upper portions of the first active patterns AP1, and second source/drain patterns SD2 may be formed at the upper portions of the second active patterns AP2. The first and second source/drain patterns SD1 and SD2 may be source/drain patterns of an access transistor (e.g., first access transistor TA1), and a source/drain pattern of the first access transistor TA1 (e.g., SD2) may be adjacent to the second portion P2 of the gate contact GC and the bottom surface of the second portion P2 may be distal to the substrate 100 in relation to a top of the source/drain pattern.

The first and second source/drain patterns SD1 and SD2 may be formed using a selective epitaxial growth (SEG) process using the substrate 100 as a seed layer. For example, the SEG process may include a chemical vapor deposition (CVD) process or a molecular beam epitaxy (MBE) process.

In more detail, the first and second active patterns AP1 and AP2 at both sides of each of the sacrificial patterns SP may be selectively etched. The first and second source/drain patterns SD1 and SD2 may be formed by the SEG process using the etched upper portions of the first and second active patterns AP1 and AP2 as the seed layer. Since the first source/drain patterns SD1 are formed, a first channel CH1 may be defined between a pair of the first source/drain patterns SD1 adjacent to each other. Since the second source/drain patterns SD2 are formed, a second channel CH2 may be defined between a pair of the second source/drain patterns SD2 adjacent to each other.

Referring to FIGS. 9 and 10A to 10D, a first interlayer insulating layer 110 may be formed to cover the first and second source/drain patterns SD1 and SD2, the sacrificial patterns SP, and the gate spacers GS. For example, the first interlayer insulating layer 110 may include a silicon oxide layer. The first interlayer insulating layer 110 may be planarized until top surfaces of the sacrificial patterns SP are exposed. The planarization process of the first interlayer insulating layer 110 may be performed using an etch-back process or a chemical mechanical polishing (CMP) process. As a result, a top surface of the first interlayer insulating layer 110 may be substantially coplanar with the top surfaces of the sacrificial patterns SP and top surfaces of the gate spacers GS.

The sacrificial patterns SP may be replaced with gate electrodes GE and insulating patterns IP. In more detail, an anisotropic etching process may be performed on the exposed sacrificial patterns SP. The anisotropic etching process may selectively remove only the sacrificial patterns SP. The insulating patterns IP may be formed in empty spaces formed by the removal of the sacrificial patterns SP.

Gate dielectric patterns GI and the gate electrodes GE may be formed in remaining empty spaces in which the insulating patterns IP are not formed.

The gate dielectric patterns GI may be conformally formed using an atomic layer deposition (ALD) process or a chemical oxidation process. For example, the gate dielectric patterns GI may include a high-k dielectric material. In an embodiment, a gate electrode layer may be formed on the gate dielectric patterns GI, and a planarization process may be performed on the gate electrode layer to form the gate electrodes GE. For example, the gate electrode layer may include at least one of a conductive metal nitride or a metal material.

The gate electrodes GE may be recessed by selectively etching upper portions of the gate electrodes GE. Top surfaces of the recessed gate electrodes GE may be lower than the top surface of the first interlayer insulating layer 110 and the top surfaces of the gate spacers GS. Gate capping patterns GP may be formed on the recessed gate electrodes GE, respectively. The formation of the gate capping patterns GP may include forming a gate capping layer covering the recessed gate electrodes GE, and planarizing the gate capping layer until the top surface of the first interlayer insulating layer 110 is exposed. For example, the gate capping layer may include at least one of SiON, SiCN, SiCON, or SiN.

A second interlayer insulating layer 120 may be formed on the first interlayer insulating layer 110 and the gate capping patterns GP. Active contacts AC may be formed in the second and first interlayer insulating layers 120 and 110. The active contacts AC may penetrate the second and first interlayer insulating layers 120 and 110 so as to be connected to the first and second source/drain patterns SD1 and SD2.

First and second gate contacts GC1 and GC2 may be formed. The first and second gate contacts GC1 and GC2 may penetrate the second interlayer insulating layer 120 and the gate capping patterns GP so as to be connected to the gate electrodes GE. The formation of the active contacts AC and the first and second gate contacts GC1 and GC2 may include forming holes defining the active contacts AC and the first and second gate contacts GC1 and GC2, and forming a conductive layer filling the holes. The conductive layer may include at least one of a metal nitride or a metal material.

Referring again to FIGS. 2 and 3A to 3D, a third interlayer insulating layer 130 may be formed on the second interlayer insulating layer 120. First interconnection lines M1 and first vias V1, which constitute a first interconnection layer, may be formed in the third interlayer insulating layer 130. The first vias V1 may be formed between the first interconnection lines M1 and the active contacts AC and between the first interconnection lines M1 and the gate contacts GC1 and GC2.

The formation of the first interconnection lines M1 and the first vias V1 may include patterning the third interlayer insulating layer 130 to form holes defining the first interconnection lines M1 and the first vias V1, and forming a conductive layer filling the holes. In other words, the first interconnection lines M1 and the first vias V1 may be formed using a dual damascene process. The first interconnection lines M1 and the first vias V1 may be formed of at least one of a conductive metal nitride or a metal material.

A fourth interlayer insulating layer 140 may be formed on the third interlayer insulating layer 130. Second interconnection lines M2 and second vias V2, which constitute a second interconnection layer, may be formed in the fourth interlayer insulating layer 140. The formation of the second interconnection lines M2 and the second vias V2 may be substantially the same as the formation of the first interconnection lines M1 and the first vias V1.

Hereinafter, the formation of the first gate contacts GC1 will be described in more detail with reference to FIGS. 11 and 12. Referring to FIG. 11, a hard mask pattern HM defining regions in which the first gate contacts GC1 will be formed may be formed on the second interlayer insulating layer 120. A first etching process may be performed on the second interlayer insulating layer 120 by using the hard mask pattern HM as an etch mask, and thus first holes H1 may be formed in the second interlayer insulating layer 120. The first etching process may be performed by a first etch recipe for selectively etching a silicon oxide layer. The first etching process may be performed until the gate capping patterns GP and the gate spacers GS are exposed.

Referring to FIG. 12, a second etching process may be performed on the gate capping patterns GP, the gate spacers GS and the first interlayer insulating layer 110, which are exposed by the first holes H1, and thus second holes H2 may be formed. The second etching process may be performed using the hard mask pattern HM as an etch mask. The second etching process may be performed by a second etch recipe different from the first etch recipe of the first etching process. The second etch recipe of the second etching process may minimize an etch rate of a silicon oxide layer and may maximize an etch rate of a silicon nitride-based material (e.g., SiCN, SiCON, and/or SiN). A bottom surface of the second hole H2 on the gate electrode GE may be disposed at a first level LV1. A bottom surface of the second hole H2 on the first interlayer insulating layer 110 may be disposed at a second level LV2. The second level LV2 may be higher than the first level LV1. Thereafter, the first gate contacts GC1 may be formed by filling the first and second holes H1 and H2 with a conductive material.

According to the manufacturing method of the inventive concepts, the bottom surface of the first gate contact GC1 on the first interlayer insulating layer 110 may be higher than the bottom surface of the first gate contact GC1 on the gate electrode GE. As a result, it is possible to prevent an electrical short between the first gate contact GC1 and the second source/drain patterns SD2.

Figure 13:
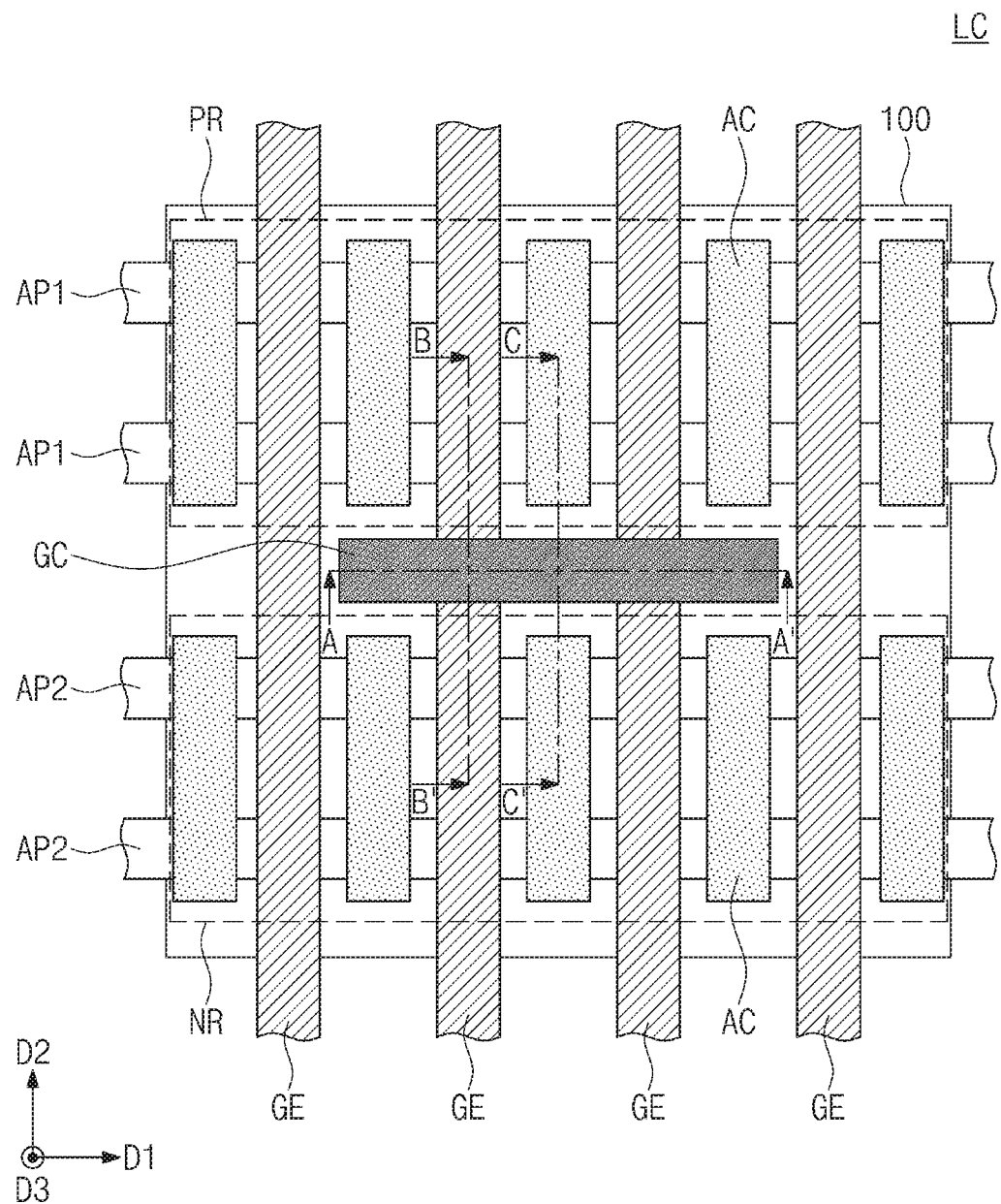
FIG. 13 is a plan view illustrating a semiconductor device according to some example embodiments of the inventive concepts.
Figure 14A:
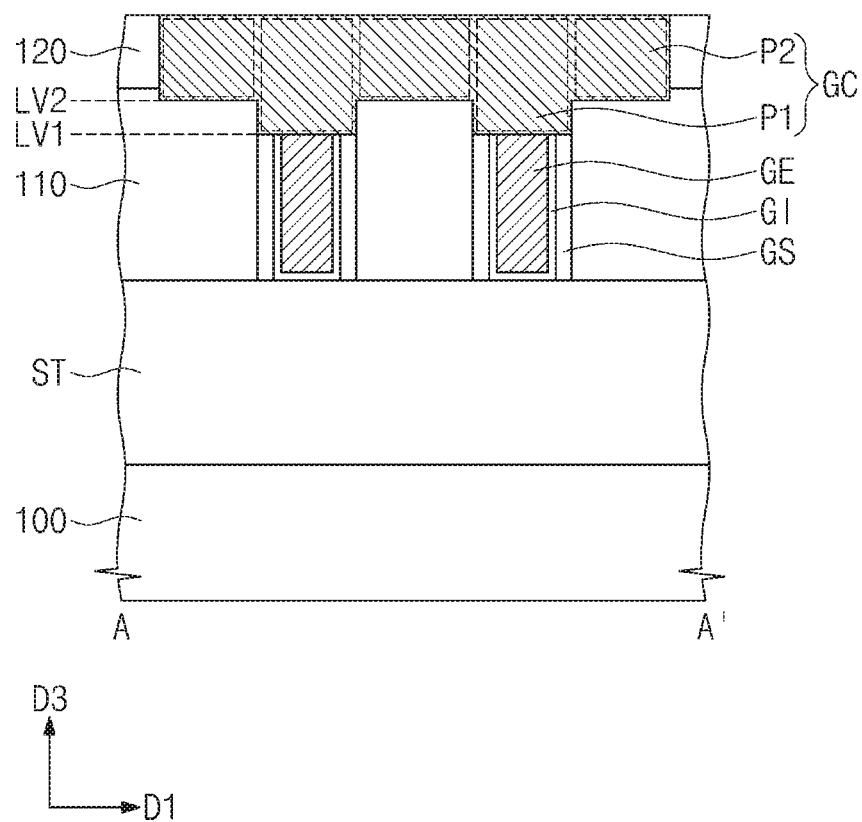
FIGS. 14A to 14C are cross-sectional views taken along lines A-A', B-B', and C-C' of FIG. 13, respectively.
Figure 14B:
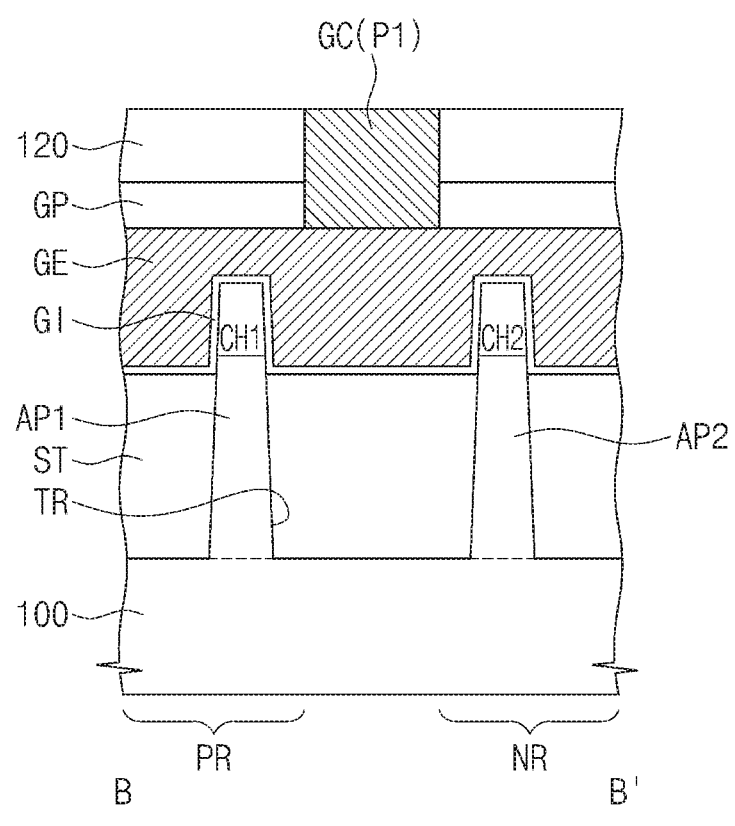
Figure 14C:
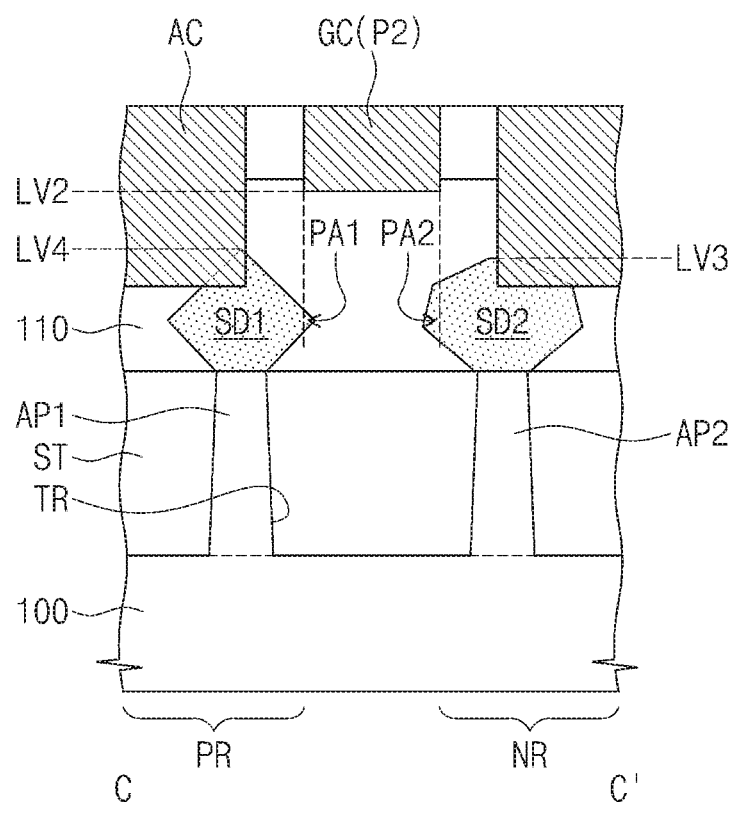
Figure 14C:
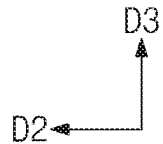

FIG. 13 is a plan view illustrating a semiconductor device according to some example embodiments of the inventive concepts. FIGS. 14A to 14C are cross-sectional views taken along lines A-A', B-B', and C-C' of FIG. 13, respectively. In some example embodiments, the descriptions to the same technical features as in the embodiments of FIGS. 2 and 3A to 3D will be omitted or mentioned briefly for the purpose of ease and convenience in explanation. In other words, differences between some example embodiments and the embodiments of FIGS. 2 and 3A to 3D will be mainly described hereinafter.

Referring to FIGS. 13 and 14A to 14C, at least one logic cell LC may be provided on a substrate 100. Logic transistors for constituting a logic circuit of a semiconductor device may be disposed in the logic cell LC. For example, the logic transistors constituting a processor core or an input/output (I/O) terminal may be disposed in the logic cell LC.

A device isolation layer ST may be provided on the substrate 100. The device isolation layer ST may define a PMOSFET region PR and an NMOSFET region NR. The PMOSFET region PR and the NMOSFET region NR may be spaced apart from each other in a second direction D2 with the device isolation layer ST interposed therebetween. The PMOSFET region PR and the NMOSFET region NR may extend in a first direction D1 intersecting the second direction D2. Even though not shown in the drawings, the device isolation layer ST between the PMOSFET region PR and the NMOSFET region NR may be deeper than the device isolation layer ST between active patterns AP1 and AP2 adjacent to each other.

A plurality of the active patterns AP1 and AP2 extending in the first direction D1 may be provided on the PMOSFET region PR and the NMOSFET region NR. The active patterns AP1 and AP2 may include first active patterns AP1 on the PMOSFET region PR and second active patterns AP2 on the NMOSFET region NR. The first and second active patterns AP1 and AP2 may be portions of the substrate 100, which protrude from a top surface of the substrate 100. The device isolation layer ST may be provided between the first active patterns AP1 adjacent to each other and between the second active patterns AP2 adjacent to each other.

First channels CH1 and first source/drain patterns SD1 may be provided in upper portions of the first active patterns AP1. Second channels CH2 and second source/drain patterns SD2 may be provided in upper portions of the second active patterns AP2. The first source/drain patterns SD1 may be P-type dopant regions. The second source/drain patterns SD2 may be N-type dopant regions. The first and second source/drain patterns SD1 and SD2 may include epitaxial patterns formed by a selective epitaxial growth (SEG) process.

Gate electrodes GE may extend in the second direction D2 to intersect the first and second active patterns AP1 and AP2. The gate electrodes GE may be spaced apart from each other in the first direction D1. For example, the gate electrodes GE may include at least one of a conductive metal nitride or a metal material. A pair of gate spacers GS may be disposed on both sidewalls of each of the gate electrodes GE, respectively. Gate dielectric patterns GI may be interposed between the gate electrodes GE and the active patterns AP1 and AP2. A gate capping pattern GP may be provided on each of the gate electrodes GE.

A first interlayer insulating layer 110 may be provided on the substrate 100. The first interlayer insulating layer 110 may cover the gate spacers GS and the first and second source/drain patterns SD1 and DD2. A second interlayer insulating layer 120 may be provided on the first interlayer insulating layer 110 to cover top surfaces of the gate capping patterns GP and top surfaces of the gate spacers GS.

Active contacts AC may be provided at both sides of each of the gate electrodes GE. The active contacts AC may penetrate the second interlayer insulating layer 120 and the first interlayer insulating layer 110 so as to be connected to the first and second source/drain patterns SD1 and SD2. As shown in FIGS. 3B-3C, the active contacts AC may be on separate, respective source/drain patterns SD1 and SD2, and top surfaces of the active contacts AC may be substantially coplanar (e.g., coplanar within manufacturing tolerances and/or material tolerances) with a top surface of the gate contact GC.

A gate contact GC may be provided on the gate electrodes GE. Restated, the semiconductor device may include a plurality of gate electrodes GE on active patterns AP1 and AP2, and the gate contact GC may be connected in common to adjacent gate electrodes GE via separate, respective first portions P1 vertically overlapping with the adjacent gate electrodes GE, where the second portion P2 of the gate contact GC is between the first portions P1. The gate contact GC may penetrate the second interlayer insulating layer 120, the gate spacers GS and the gate capping patterns GP so as to be connected to the gate electrode GE. The gate contact GC may have a bar shape extending in the first direction D1. In some example embodiments, the gate contact GC may be connected to at least two gate electrodes GE adjacent to each other. The gate contact GC may be provided on the device isolation layer ST between the PMOSFET region PR and the NMOSFET region NR.

Restated, and as shown in at least FIGS. 14B-14C, where the active patterns include a first active pattern AP1 on a PMOSFET region PR of the substrate 100 and a second active pattern AP2 on an NMOSFET region NR of the substrate 100, the gate contact may be on the device isolation layer ST may be between the PMOSFET region PR and the NMOSFET region NR.

The gate contact GC may include first portions P1 vertically overlapping with the gate electrodes GE and second portions P2 laterally extending from the first portions P1. One of the second portions P2 may be interposed between the first portions P1 adjacent to each other. The second portions P2 may vertically overlap with the device isolation layer ST between the PMOSFET region PR and the NMOSFET region NR.

A bottom surface of the first portion P1 may be disposed at a first level LV1, and a bottom surface of the second portion P2 may be disposed at a second level LV2. The second level LV2 may be higher than the first level LV1.

The second portion P2 may be disposed on the first interlayer insulating layer 110 between the first source/drain pattern SD1 and the second source/drain pattern SD2 which are adjacent to each other. A top of the second source/drain pattern SD2 may be disposed at a third level LV3, and a top of the first source/drain pattern SD1 may be disposed at a fourth level LV4. The second level LV2 which is the level of the bottom surface of the second portion P2 may be higher than the third level LV3 and may also be higher than the fourth level LV4.

At least a portion PA1 of the first source/drain pattern SD1 of the first and second source/drain patterns SD1 and SD2 adjacent to each other may vertically overlap with the second portion P2. At least a portion PA2 of the second source/drain pattern SD2 of the first and second source/drain patterns SD1 and SD2 adjacent to each other may vertically overlap with the second portion P2.

According to some example embodiments of the inventive concepts, the second level LV2 of the bottom surface of the second portion P2 may be higher than the third level LV3 and the fourth level LV4. Thus, the second portion P2 may not be in contact with the portions PA1 and PA2 of the first and second source/drain patterns SD1 and SD2. As a result, it is possible to prevent an electrical short between the gate contact GC and the first and second source/drain patterns SD1 and SD2.

Even though not shown in the drawings, a plurality of interconnection layers may be vertically stacked on the second interlayer insulating layer 120.

Figure 15:
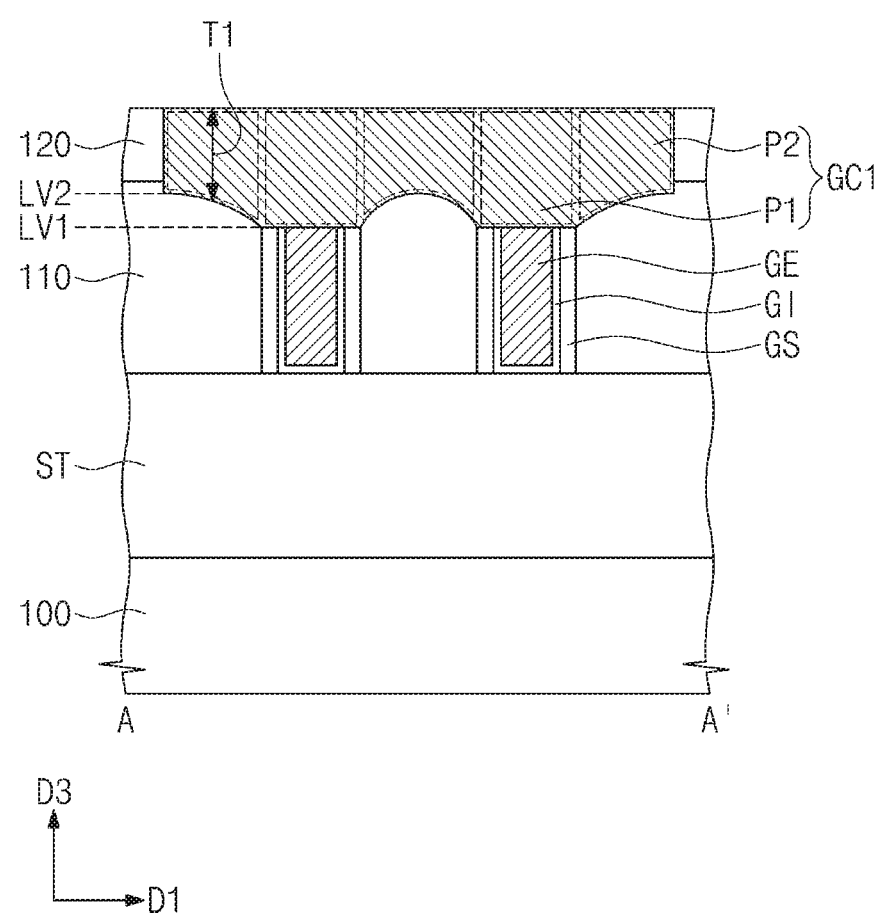
FIG. 15 is a cross-sectional view taken along the line A-A' of FIG. 13 to illustrate a semiconductor device according to some example embodiments of the inventive concepts.

FIG. 15 is a cross-sectional view taken along the line A-A' of FIG. 13 to illustrate a semiconductor device according to some example embodiments of the inventive concepts. In some example embodiments, the descriptions to the same technical features as in the embodiments of FIGS. 13 and 14A to 14C will be omitted for the purpose of ease and convenience in explanation. In other words, differences between some example embodiments and the embodiments of FIGS. 13 and 14A to 14C will be mainly described hereinafter.

Referring to FIGS. 13 and 15, the gate contact GC may include first portions P1 vertically overlapping with the gate electrodes GE, and second portions P2 laterally extending from the first portions P1.

The highest level of a bottom surface of the second portion P2 may be the second level LV2. A level of the bottom surface of the second portion P2 may become lower toward the first portion P1. In other words, a vertical thickness T1 of the second portion P2 may decrease as a horizontal distance from the first portion P1 increases.

The second portion P2 interposed between a pair of the first portions P1 adjacent to each other may have a rounded bottom surface. The bottom surface of the second portion P2 interposed between the first portions P1 may have a concave shape. In other words, the gate contact GC may have an arch-shaped bridge structure.

Top surfaces of the first portions P1 and top surfaces of the second portions P2 may be flat. The top surfaces of the first portions P1 and the top surfaces of the second portions P2 may be coplanar with a top surface of the second interlayer insulating layer 120.

In the semiconductor device according to some example embodiments of the inventive concepts, the portion of the gate contact adjacent to the source/drain pattern may be disposed at a relatively high level. Thus, an electrical short between the gate contact and the source/drain pattern may be prevented, and reliability of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
    a substrate including a plurality of active patterns;
    a device isolation layer filling a trench between a pair of adjacent active patterns of the plurality of active patterns;
    a gate electrode on the plurality of active patterns; and
    a gate contact on the gate electrode,
    wherein each active pattern of the plurality of active patterns includes a separate source/drain pattern, of a plurality of source/drain patterns, at each side of opposite sides of the gate electrode,
    wherein the gate contact includes
    a first portion vertically overlapping with the gate electrode, a bottom surface of the first portion being a closest surface of the gate contact to the substrate, the bottom surface of the first portion distal from the substrate in relation to the gate electrode; and
    a second portion laterally extending from the first portion such that the second portion vertically overlaps with the device isolation layer and does not vertically overlap with the gate electrode,
    wherein a bottom surface of the second portion is distal to the substrate in relation to the bottom surface of the first portion,
    wherein the bottom surface of the second portion is distal to the substrate in relation to a top of a source/drain pattern of the plurality of source/drain patterns that is adjacent to the second portion,
    wherein the semiconductor device further includes an interlayer insulating layer covering the plurality of source/drain patterns,
    wherein the plurality of active patterns extend in a first direction,
    wherein the gate electrode extends in a second direction, the second direction intersecting the first direction,
    wherein the interlayer insulating layer is between source/drain patterns adjacent to each other in the second direction,
    wherein the second portion is on the interlayer insulating layer.

2. The semiconductor device of claim 1, wherein at least a portion of the source/drain pattern that is adjacent to the second portion vertically overlaps with the second portion.

3. The semiconductor device of claim 1, wherein a bottom surface of the gate contact has a stepped profile at a boundary between the first portion and the second portion.

4. The semiconductor device of claim 1, wherein a vertical thickness of the second portion is inversely proportional to a horizontal distance from the first portion.

5. The semiconductor device of claim 1, further comprising:
    a via on the second portion; and
    a word line electrically connected to the gate contact through the via,
    wherein the active patterns and the gate electrode include memory transistors of a static random access memory (SRAM) cell.

6. The semiconductor device of claim 1, wherein further comprising:
    a plurality of gate electrodes on the plurality of active patterns, the plurality of gate electrodes including the gate electrode,
    wherein the gate contact is connected in common to adjacent gate electrodes of the plurality of gate electrodes via separate, respective first portions vertically overlapping with the adjacent gate electrodes, and
    wherein the second portion of the gate contact is between the first portions.

7. The semiconductor device of claim 6, wherein the plurality of active patterns include
    a first active pattern on a PMOSFET region of the substrate, and
    a second active pattern on an NMOSFET region of the substrate,
    wherein the gate contact is on the device isolation layer and is between the PMOSFET region and the NMOSFET region.

8. The semiconductor device of claim 1, further comprising:
    a plurality of active contacts on separate, respective source/drain patterns of the plurality of source/drain patterns,
    wherein top surfaces of the active contacts are substantially coplanar with a top surface of the gate contact.

9. The semiconductor device of claim 1, wherein
    upper portions of the plurality of active patterns have fin-shapes vertically protruding from the device isolation layer, and
    the plurality of source/drain patterns include epitaxial patterns in the upper portions of the plurality of active patterns.

10. A semiconductor device comprising:
    a substrate including an active pattern extending in a first direction;

a device isolation layer on the substrate, such that the device isolation layer defines at least one boundary of the active pattern;

a gate electrode on the device isolation layer, the gate electrode intersecting the active pattern, the gate electrode extending in a second direction; and a gate contact on the gate electrode, wherein the active pattern includes a source/drain pattern at one side of the gate electrode, wherein the gate contact includes a first portion vertically overlapping with the gate electrode, and a second portion extending from the first portion in the first direction, wherein a bottom surface of the second portion is distal to the substrate in relation to a bottom surface of the first portion, and wherein at least a portion of the source/drain pattern vertically overlaps with the second portion, wherein the semiconductor device further includes an interlayer insulating layer covering the source/drain pattern, wherein the second portion is isolated from direct contact with the source/drain pattern, and the interlayer insulating layer is between the second portion and the source/drain pattern.

11. The semiconductor device of claim 10, wherein the bottom surface of the second portion is distal to the substrate in relation to a top of the source/drain pattern.

12. The semiconductor device of claim 10, further comprising:

a via on the second portion; and a word line electrically connected to the gate contact through the via, wherein the active pattern and the gate electrode include an access transistor of a static random access memory (SRAM) cell.

13. The semiconductor device of claim 10, further comprising:

a plurality of gate electrodes on the active pattern, the plurality of gate electrodes including the gate electrode, wherein the gate contact is connected in common to adjacent gate electrodes of the plurality of gate electrodes via separate, respective first portions vertically overlapping with the adjacent gate electrodes, and wherein the second portion of the gate contact is between the first portions.

14. A semiconductor device comprising:

a static random access memory (SRAM) cell on a substrate, wherein the SRAM cell includes first and second access transistors;

first and second pull-up transistors; and first and second pull-down transistors, wherein a gate electrode of the first access transistor is electrically connected to a word line through a gate contact and a via on the gate contact, wherein the gate contact includes a first portion vertically overlapping with the gate electrode, a bottom surface of the first portion being a closest surface of the gate contact to the substrate, the bottom surface of the first portion distal from the substrate in relation to the gate electrode, and a second portion laterally extending from the first portion, wherein the via is on the second portion, and wherein a bottom surface of the second portion is distal to the substrate in relation to the bottom surface of the first portion.

15. The semiconductor device of claim 14, wherein a source/drain pattern of the first access transistor is adjacent to the second portion, and the bottom surface of the second portion is distal to the substrate in relation to a top of the source/drain pattern.

16. The semiconductor device of claim 15, wherein at least a portion of the source/drain pattern vertically overlaps with the second portion.

17. The semiconductor device of claim 16, further comprising:

an interlayer insulating layer covering the source/drain pattern, wherein the second portion is isolated from direct contact with the source/drain pattern, and the interlayer insulating layer is between the second portion and the source/drain pattern.

18. The semiconductor device of claim 14, wherein the first and second access transistors, first and second pull-up transistors, and first and second pull-down transistors of the SRAM cell have active patterns, which have fin-shapes vertically protruding from a device isolation layer, as active regions.

* * * * *